(12) United States Patent
Yamazaki et al.

(10) Patent No.: US 12,506,126 B2
(45) Date of Patent: Dec. 23, 2025

(54) DISPLAY DEVICE

(71) Applicant: Semiconductor Energy Laboratory Co., Ltd., Atsugi (JP)

(72) Inventors: Shunpei Yamazaki, Setagaya (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 663 days.

(21) Appl. No.: 17/828,399

(22) Filed: May 31, 2022

(65) Prior Publication Data
US 2022/0407040 A1 Dec. 22, 2022

(30) Foreign Application Priority Data
Jun. 17, 2021 (JP) .................................. 2021-101052

(51) Int. Cl.
*H01L 25/16* (2023.01)
*H01L 25/18* (2023.01)
(Continued)

(52) U.S. Cl.
CPC ......... *H01L 25/167* (2013.01); *H10K 59/122* (2023.02); *H10K 59/353* (2023.02);
(Continued)

(58) Field of Classification Search
CPC .. H10K 50/865; H10K 50/858; H10K 59/353; H10K 59/122; H10K 59/38;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.
(Continued)

*Primary Examiner* — Timor Karimy
(74) *Attorney, Agent, or Firm* — Eric J. Robinson; Robinson Intellectual Property Law Office, P.C.

(57) ABSTRACT

A high-resolution display device is provided. A display device having both high display quality and high resolution is provided. The display device is provided with a structure that inhibits a reduction in contrast due to the light guided by a layer extending across light-emitting elements. A structure body that absorbs or reflects visible light is provided between adjacent light-emitting elements. This structure body absorbs or reflects the light emitted from a light-emitting element and traveling toward an adjacent pixel, whereby a reduction in contrast due to stray light is inhibited.

9 Claims, 19 Drawing Sheets

(51) Int. Cl.

| | |
|---|---|
| *H10K 50/856* | (2023.01) |
| *H10K 59/122* | (2023.01) |
| *H10K 59/35* | (2023.01) |
| *H10K 59/38* | (2023.01) |
| *H10K 59/80* | (2023.01) |
| *H01L 23/00* | (2006.01) |
| *H10K 59/00* | (2023.01) |

(52) U.S. Cl.
CPC .......... *H10K 59/8792* (2023.02); *H01L 24/05* (2013.01); *H01L 24/08* (2013.01); *H01L 24/16* (2013.01); *H01L 24/32* (2013.01); *H01L 24/73* (2013.01); *H01L 25/18* (2013.01); *H01L 2224/05567* (2013.01); *H01L 2224/05568* (2013.01); *H01L 2224/0557* (2013.01); *H01L 2224/05647* (2013.01); *H01L 2224/08147* (2013.01); *H01L 2224/16148* (2013.01); *H01L 2224/32145* (2013.01); *H01L 2224/73204* (2013.01); *H10K 50/856* (2023.02); *H10K 59/38* (2023.02); *H10K 59/751* (2023.02); *H10K 59/879* (2023.02)

(58) Field of Classification Search
CPC ......... H01L 24/05; H01L 24/08; H01L 24/16; H01L 24/32; H01L 24/73; H01L 24/18; H01L 25/18; H01L 2224/05567; H01L 2224/05568; H01L 2224/0557; H01L 2224/05647; H01L 2224/08147; H01L 2224/16148; H01L 2224/32145; H01L 2224/73204

See application file for complete search history.

(56) References Cited

U.S. PATENT DOCUMENTS

| | | | |
|---|---|---|---|
| 2002/0072139 A1 | 6/2002 | Kashiwabara | |
| 2007/0222368 A1* | 9/2007 | Lee ..................... | H10K 59/875 313/506 |
| 2008/0169478 A1* | 7/2008 | Muranaka ............ | H01L 25/167 257/E25.032 |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0093678 A1* | 3/2016 | Seo ..................... | H10K 59/35 257/89 |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0057330 A1 | 2/2020 | Yamazaki et al. | |
| 2020/0203662 A1 | 6/2020 | Mollard et al. | |

FOREIGN PATENT DOCUMENTS

| | | |
|---|---|---|
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke. T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19: SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17: SID International Symposium Digest of Technical Papers, May 1, 2017, vol. 48, No. 1, pp. 623-626.

* cited by examiner

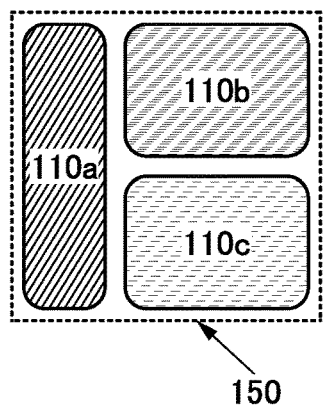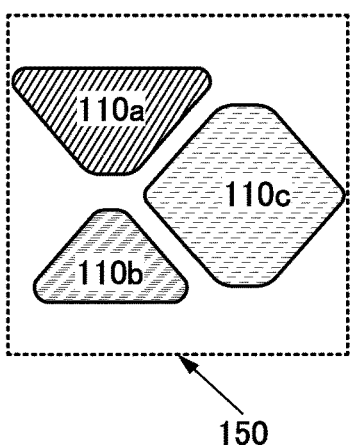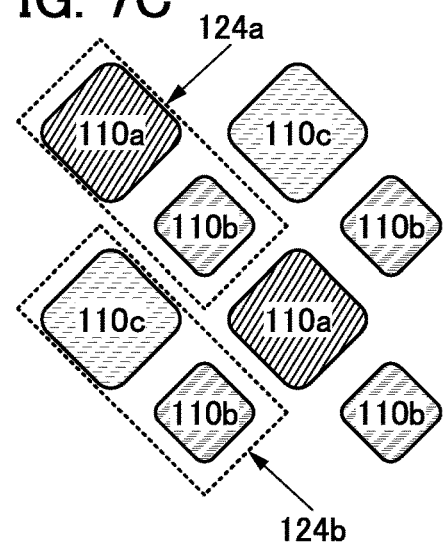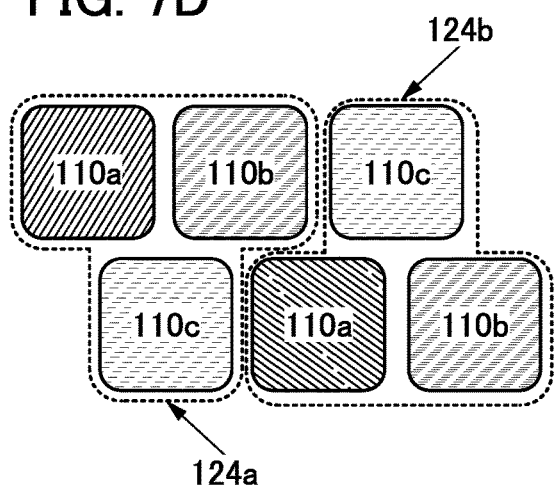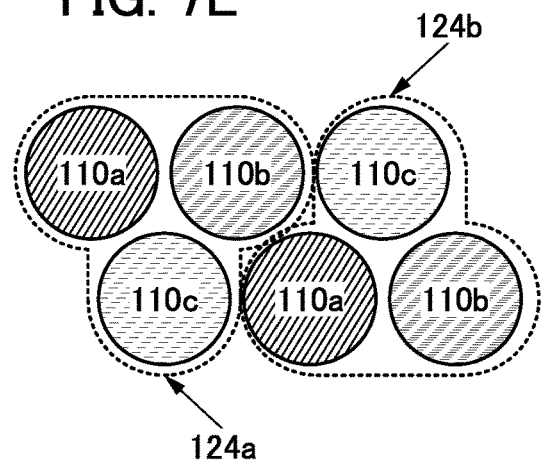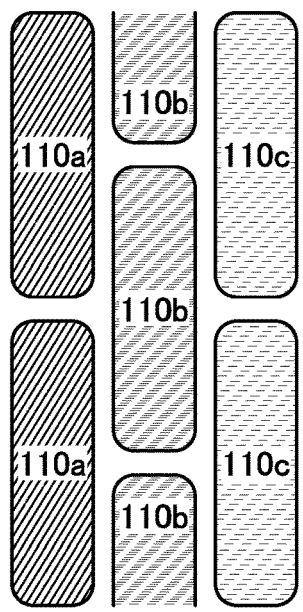

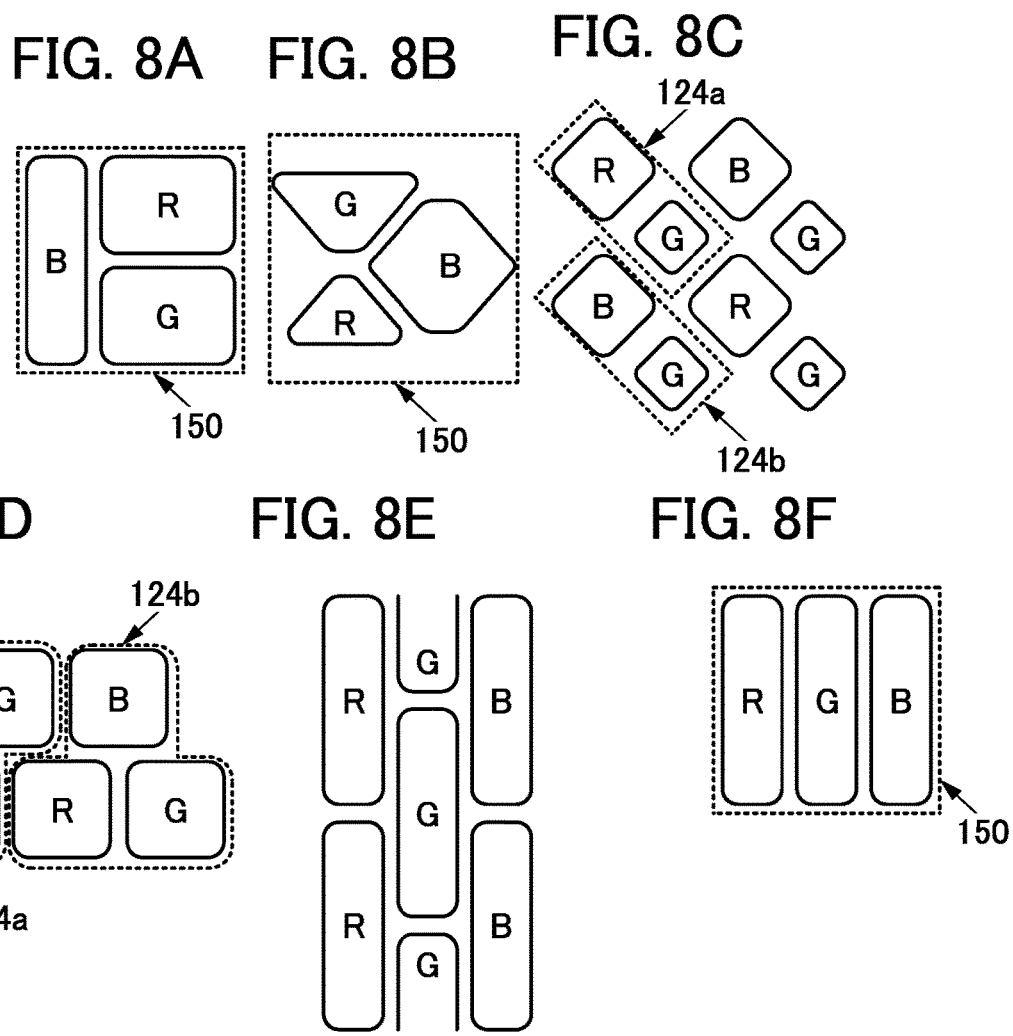

DISPLAY DEVICE

BACKGROUND OF THE INVENTION

1. Field of the Invention

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to a device that can function by utilizing semiconductor characteristics in general.

2. Description of the Related Art

In recent years, higher resolution has been required for display panels. Examples of devices that require high-resolution display panels include a smartphone, a tablet terminal, and a laptop computer. Furthermore, higher resolution has been required for a stationary display device such as a television device or a monitor device along with an increase in definition. A device absolutely required to have a high-resolution display panel is a device for virtual reality (VR) or augmented reality (AR).

Examples of the display device that can be used for a display panel include, typically, a liquid crystal display device, a light-emitting apparatus including a light-emitting element such as an organic electroluminescent (EL) element or a light-emitting diode (LED), and electronic paper performing display by an electrophoretic method or the like.

Patent Document 1, for example, discloses an example of a VR display device using an organic EL element.

Organic EL devices are sometimes used in display portions of display devices and HMDs for AR or VR. Non-Patent Document 1 discloses a manufacturing method of an organic optoelectronic device using standard UV photolithography, as an organic EL device.

REFERENCES

Patent Document

[Patent Document 1] International Publication No. WO2018/087625

Non-Patent Document

[Non-Patent Document 1] B. Lamprecht et al., "Organic optoelectronic device fabrication using standard UV photolithography" phys. stat. sol. (RRL) 2, No. 1, pp. 16-18 (2008)

SUMMARY OF THE INVENTION

An object of one embodiment of the present invention is to provide a high-resolution display device. An object of one embodiment of the present invention is to provide a display device having both high display quality and high resolution. An object of one embodiment of the present invention is to provide a display device with high color reproducibility. An object of one embodiment of the present invention is to provide a display device with high contrast. An object of one embodiment of the present invention is to provide a display device having a high aperture ratio. An object of one embodiment of the present invention is to provide a display device with high contrast. An object of one embodiment of the present invention is to provide a highly reliable display device.

Note that the description of these objects does not preclude the existence of other objects. In one embodiment of the present invention, there is no need to achieve all the objects. Objects other than these can be derived from the description of the specification, the drawings, the claims, and the like.

One embodiment of the present invention is a display device that includes a first pixel electrode, a second pixel electrode, a first organic layer, a second organic layer, a common electrode, and a resin layer. The first organic layer is over the first pixel electrode. The second organic layer is over the second pixel electrode. The common electrode includes a portion overlapping with the first pixel electrode with the first organic layer therebetween, a portion overlapping with the second pixel electrode with the second organic layer therebetween, and a portion overlapping with the resin layer. A side surface of the first organic layer and a side surface of the second organic layer face each other with the resin layer therebetween. The resin layer contains a pigment absorbing visible light.

Another embodiment of the present invention is a display device that includes a first pixel electrode, a second pixel electrode, a first organic layer, a second organic layer, a common electrode, a resin layer, and a first light-blocking layer. The first organic layer is over the first pixel electrode. The second organic layer is over the second pixel electrode. The common electrode includes a portion overlapping with the first pixel electrode with the first organic layer therebetween, a portion overlapping with the second pixel electrode with the second organic layer therebetween, and a portion overlapping with the resin layer. A side surface of the first organic layer and a side surface of the second organic layer face each other with the resin layer therebetween. The first light-blocking layer is over the common electrode and overlaps with the resin layer. The first light-blocking layer contains a pigment absorbing visible light.

The above structure preferably includes a second light-blocking layer. In this case, the second light-blocking layer preferably overlaps with the resin layer with the first light-blocking layer and the common electrode therebetween. The second light-blocking layer preferably contains a pigment absorbing visible light.

Another embodiment of the present invention is a display device that includes a first pixel electrode, a second pixel electrode, a first organic layer, a second organic layer, a common electrode, a resin layer, and a light-guiding layer. The first organic layer is over the first pixel electrode. The second organic layer is over the second pixel electrode. The common electrode includes a portion overlapping with the first pixel electrode with the first organic layer therebetween, a portion overlapping with the second pixel electrode with the second organic layer therebetween, and a portion overlapping with the resin layer. A side surface of the first organic layer and a side surface of the second organic layer face each other with the resin layer therebetween. The light-guiding layer is over the common electrode. The light-guiding layer includes a first light-guiding portion overlapping with the first pixel electrode and having a columnar shape, a second light-guiding portion overlapping with the second pixel electrode and having a columnar shape, and a reflecting portion between the first light-guiding portion and the second light-guiding portion.

In the above structure, the reflecting portion preferably includes a cavity. In this case, it is preferable that the first light-guiding portion and the second light-guiding portion each have a higher refractive index than the cavity.

In the above structure, the reflecting portion preferably includes a material with a property of reflecting visible light.

In any of the above structures, the light-guiding layer preferably includes a lens portion. The lens portion includes a first lens and a second lens. The first lens and the second lens are each a convex lens. The first lens includes a portion overlapping with the first pixel electrode with the first light-guiding portion therebetween. The second lens includes a portion overlapping with the second pixel electrode with the second light-guiding portion therebetween.

In any of the above structures, the resin layer preferably includes an acrylic resin, a polyimide resin, an epoxy resin, a polyamide resin, a polyimide-amide resin, a siloxane resin, a benzocyclobutene-based resin, a phenol resin, or a precursor of any of these resins.

Any of the above structures preferably includes an insulating layer including a portion between the resin layer and the first organic layer and a portion between the resin layer and the second organic layer. The insulating layer preferably includes silicon oxide, silicon oxynitride, silicon nitride oxide, silicon nitride, aluminum oxide, aluminum oxynitride, or hafnium oxide.

In any of the above structures, the first organic layer preferably emits light of a color different from a color of light emitted by the second organic layer.

Any of the above structures preferably includes a first coloring layer and a second coloring layer. In this case, the first coloring layer includes a portion overlapping with the first pixel electrode with the common electrode and the first organic layer therebetween. The second coloring layer includes a portion overlapping with the second pixel electrode with the common electrode and the second organic layer therebetween. The first coloring layer transmits light of a color different from a color of light transmitted by the second coloring layer. The first organic layer preferably emits light of the same color as light emitted by the second organic layer.

According to one embodiment of the present invention, a high-resolution display device can be provided. According to one embodiment of the present invention, a display device having both high display quality and high resolution can be provided. According to one embodiment of the present invention, a display device with high color reproducibility can be provided. According to one embodiment of the present invention, a display device with high contrast can be provided. According to one embodiment of the present invention, a display device having a high aperture ratio can be provided. According to one embodiment of the present invention, a display device with high contrast can be provided. According to one embodiment of the present invention, a highly reliable display device can be provided.

Note that the description of these effects does not preclude the existence of other effects. One embodiment of the present invention does not necessarily have all the effects. Effects other than these can be derived from the description of the specification, the drawings, the claims, and the like.

BRIEF DESCRIPTION OF THE DRAWINGS

FIGS. 7A to 7F are top views illustrating examples of pixels.

FIGS. 8A to 8F are top views illustrating examples of pixels.

DETAILED DESCRIPTION OF THE INVENTION

Figure 1A:
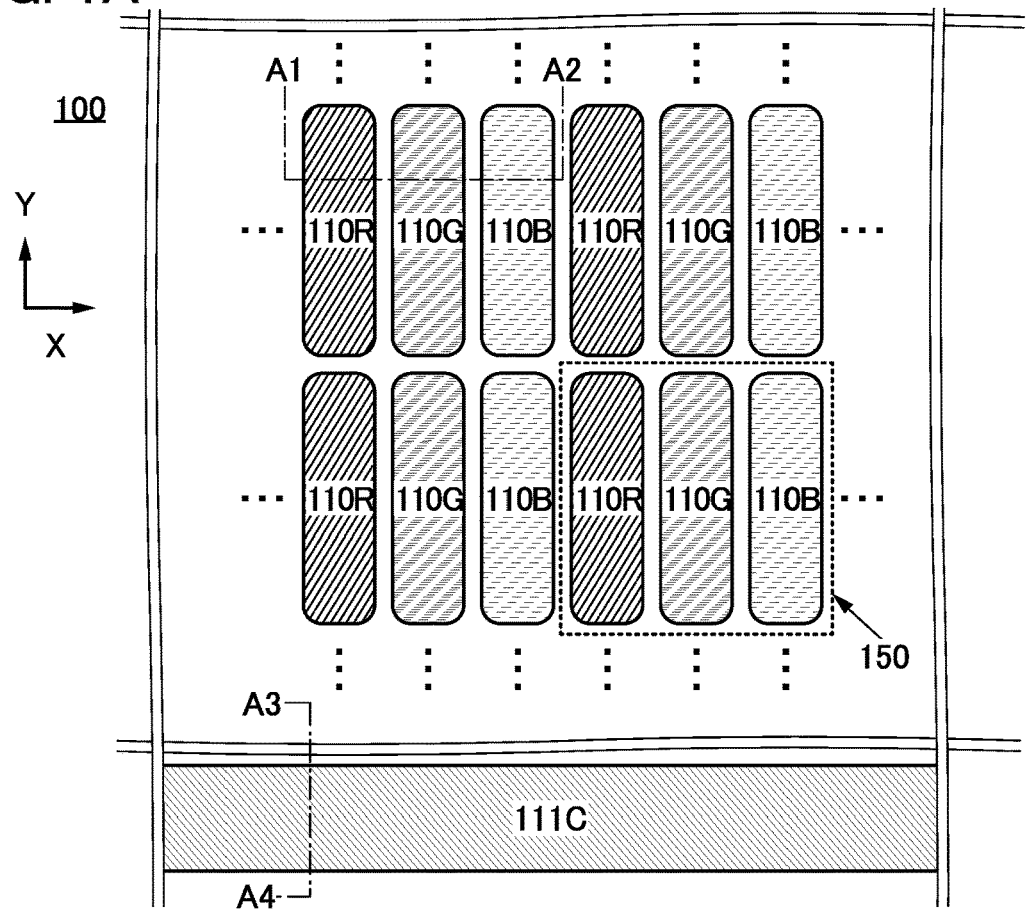
FIGS. 1A to 1C illustrate a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

In this specification and the like, the terms "film" and "layer" can be interchanged with each other. For example, in some cases, the terms "conductive layer" and "insulating layer" can be changed into "conductive film" and "insulating film", respectively.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

Embodiment 1

In this embodiment, structure examples of a display device of one embodiment of the present invention are described.

One embodiment of the present invention is a display device including a light-emitting element (also referred to as a light-emitting device). The display device includes at least two light-emitting elements which emit light of different colors. The light-emitting elements each include a pair of electrodes and an EL layer therebetween. The light-emitting element is preferably an organic electroluminescent element (organic EL element). The two or more light-emitting elements emitting light of different colors include respective EL layers containing different materials. For example, three kinds of light-emitting elements emitting red (R), green (G), and blue (B) light are included, whereby a full-color display device can be obtained.

In the case of manufacturing a display device including a plurality of light-emitting elements emitting light of different colors, at least light-emitting layers different in emission color each need to be formed in an island shape. In a known method for separately forming part or the whole of an EL layer, an island-shaped organic film is formed by an evaporation method using a shadow mask such as a metal mask. However, this method has difficulty in achieving high resolution and a high aperture ratio of a display device because in this method, a deviation from the designed shape and position of the island-shaped organic film is caused by various influences such as the low accuracy of the metal mask position, the positional deviation between the metal mask and a substrate, a warp of the metal mask, and the vapor-scattering-induced expansion of the outline of the formed film. In addition, the outline of a layer may blur during vapor deposition, whereby the thickness of its end portion may be small. That is, the thickness of an island-shaped light-emitting layer may vary from area to area. In the case of manufacturing a display device with a large size, high definition, or high resolution, the manufacturing yield might be reduced because of low dimensional accuracy of the metal mask and deformation due to heat or the like. Thus, a measure has been taken for pseudo improvement in resolution (also referred to pixel density). As a specific measure, a unique pixel arrangement such as a PenTile pattern has been employed.

In one embodiment of the present invention, fine patterning of an EL layer is performed by photolithography without a shadow mask such as a metal mask. With the patterning, a high-resolution display device with a high aperture ratio, which has been difficult to achieve, can be fabricated. Moreover, EL layers can be formed separately, enabling the display device to perform extremely clear display with high contrast and high display quality. Note that one embodiment of the present invention is not limited to the above structure. For example, a structure in which fine patterning of an EL layer is performed using both a metal mask and photolithography is also one embodiment of the present invention.

Part or the whole of the EL layer can be physically partitioned, inhibiting a leakage current flowing between adjacent light-emitting elements through a layer (also referred to as a common layer) shared by the light-emitting elements. This can prevent crosstalk due to unintended light emission, so that a display device with extremely high contrast can be obtained. Specifically, a display device having high current efficiency at low luminance can be obtained.

Between two light-emitting elements that are adjacent to each other, there is a region (depression) where the EL layers of the light-emitting elements are not provided. In the case where the depression is covered with a common electrode or with a common electrode and a common layer, the common electrode might be disconnected (or "step-cut") by a step at an end portion of the EL layer, thereby causing insulation of the common electrode over the EL layer. In view of this, the height gap between the two adjacent light-emitting elements is preferably filled with a resin layer (also referred to as local filling planarization, or LFP) serving as a planarization film. The resin layer has a function of a planarization film. This structure can inhibit a step-cut of the common layer or the common electrode, making it possible to obtain a highly reliable display device.

In the case where the above resin layer is provided, the EL layer might be dissolved by a solvent or the like used in formation of the resin layer. Thus, between the EL layer and the resin layer is preferably provided an inorganic insulating layer serving as a barrier film. Specifically, it is preferable that the inorganic insulating layer be provided in contact with a side surface and a top surface of an end portion of the EL layer, and the resin layer be provided over the inorganic insulating layer.

In addition, one embodiment of the present invention has a structure that inhibits a reduction in contrast due to the light (also referred to as guided light or stray light) guided by a layer extending across light-emitting elements. Specifically, a structure body that absorbs or reflects visible light is provided between adjacent light-emitting elements. This allows the structure body to absorb or reflect the light emitted from a light-emitting element and traveling toward an adjacent pixel, whereby a reduction in contrast due to stray light can be inhibited.

The structure body can be positioned to overlap with the above resin layer serving as the planarization film. In this manner, the display device can have high contrast without compromising the aperture ratio (effective light-emitting area ratio).

For the structure body absorbing visible light, a material that absorbs visible light, a resin that contains a pigment absorbing visible light, or the like can be used. For example, it is possible to use a resin that can be used as a color filter transmitting red, blue, or green light and absorbing light of the other colors; or a resin that contains carbon black as a pigment and serves as a black matrix.

The structure body reflecting visible light can be a structure body containing a reflective metal or a reflective alloy, or an insulating structure body covered with the metal or the alloy. Alternatively, it is possible to use a structure body that utilizes total reflection due to a difference in refractive index. For example, a light-guiding portion, which serves as a path of light, can be surrounded by a structure body with a refractive index lower than that of the light-guiding portion. The structure body having a lower refractive index preferably has a cavity in order that the light-guiding portion and the structure body can easily have a large difference in refractive index.

The above resin layer serving as the planarization film may also serve as a structure body inhibiting stray light. When formed using a material absorbing visible light, the resin layer can absorb the light emitted from the light-emitting element in a lateral direction, inhibiting a reduction in contrast. Moreover, when formed to have a convex top surface, the resin layer can also absorb the light emitted obliquely upward from the light-emitting element, thereby more effectively reducing the influence of stray light.

As described above, in the method for manufacturing a display device according to one embodiment of the present invention, part or the whole of an EL layer is processed into an island shape without using a metal mask. Specifically, a sacrificial layer is stacked over an organic film to be the EL layer, a resist mask is formed over the sacrificial layer, and the organic film and the sacrificial layer are etched to form the EL layer and the sacrificial layer that have an island shape.

As a way of processing the EL layer into an island shape, there is performing processing by a photolithography method directly on a light-emitting layer. In this way, damage to the light-emitting layer (e.g., processing damage) might significantly degrade the reliability. In view of the above, in the manufacture of the display device of one embodiment of the present invention, a sacrificial layer or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable display device.

As described above, the island-shaped EL layer in one embodiment of the present invention is formed by etching, not with a metal mask. Accordingly, a high-resolution display device or a display device with a high aperture ratio, each of which has been difficult to achieve, can be obtained. Moreover, EL layers can be formed separately for the respective colors, enabling the display device to perform extremely clear display with high contrast and high display quality. Moreover, providing the sacrificial layer over the EL layer can reduce damage to the EL layer in the manufacturing process of the display device, resulting in an increase in reliability of the light-emitting device.

The interval between adjacent light-emitting devices can be reduced to less than 10 μm, less than or equal to 5 μm, less than or equal to 3 μm, less than or equal to 2 μm, or less than or equal to 1 μm by the above-described method, whereas it is difficult for a formation method using a metal mask, for example, to reduce the interval to less than 10 μm. Furthermore, for example, with the use of a light exposure tool for LSI, the interval between adjacent light-emitting devices can be reduced to be less than or equal to 500 nm, less than or equal to 200 nm, less than or equal to 100 nm, or even less than or equal to 50 nm. Accordingly, the area of a non-light-emitting region that may exist between two light-emitting devices can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

More specific structures are described below with reference to drawings.

Structure Example 1

FIG. 1A is a schematic top view of a display device 100 of one embodiment of the present invention. The display device 100 includes a plurality of pixels 150 provided over an insulating layer 103 over a substrate 101. The pixel 150 includes a light-emitting element 110R exhibiting red, a light-emitting element 110G exhibiting green, and a light-emitting element 110B exhibiting blue. In FIG. 1A, light-emitting regions of the light-emitting elements are denoted by 110R, 110G, and 110B to easily differentiate the light-emitting elements.

The light-emitting elements 110R, the light-emitting elements 110G, and the light-emitting elements 110B are arranged in a matrix. FIG. 1A shows what is called a stripe arrangement, in which elements of the same color are arranged in the Y direction and elements of different colors are arranged sequentially in the X direction. Note that the arrangement of the light-emitting elements is not limited thereto; another arrangement such as an S stripe, delta, Bayer, zigzag, PenTile, or diamond pattern may also be used.

As each of the light-emitting elements 110R, 110G, and 110B, an EL element such as an organic light-emitting diode (OLED) or a quantum-dot light-emitting diode (QLED) is preferably used. Examples of a light-emitting substance contained in the EL element include a substance exhibiting fluorescence (fluorescent material), a substance exhibiting phosphorescence (phosphorescent material), and a substance exhibiting thermally activated delayed fluorescence (a thermally activated delayed fluorescent (TADF) material). Examples of the light-emitting substance contained in the EL element include not only organic compounds but also inorganic compounds (e.g., quantum dot materials).

FIG. 1A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, a top surface of the connection electrode 111C can have a band shape, an L shape, a square bracket shape, a quadrangular shape, or the like.

Figure 1B:
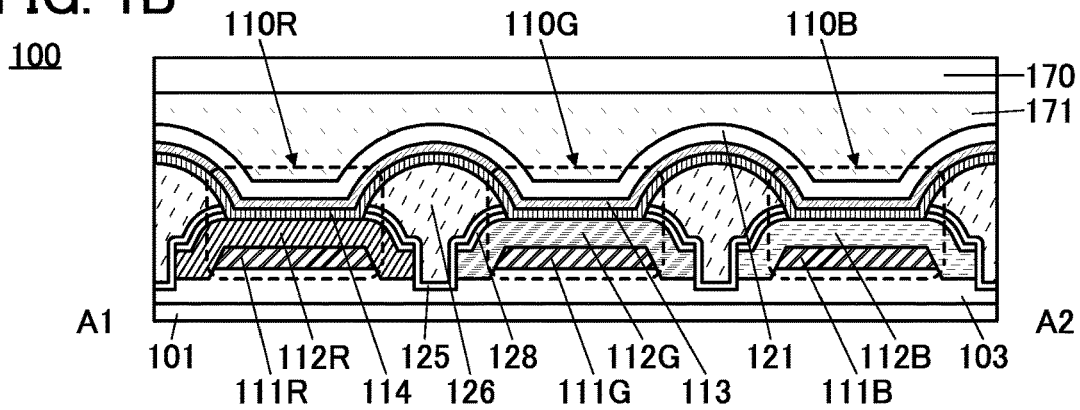
Figure 1C:
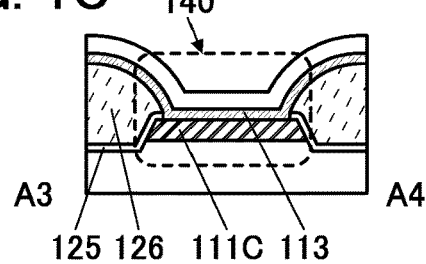

FIGS. 1B and 1C are the schematic cross-sectional views taken along dashed-dotted line A1-A2 and dashed-dotted line A3-A4 in FIG. 1A. FIG. 1B is a schematic cross-sectional view of the light-emitting element 110R, the light-emitting element 110G, and the light-emitting element 110B, and FIG. 1C is a schematic cross-sectional view of the connection electrode 111C.

The light-emitting element 110R includes a pixel electrode 111R, an organic layer 112R, an organic layer 114, and the common electrode 113. The light-emitting element 110G includes a pixel electrode 111G, an organic layer 112G, the organic layer 114, and the common electrode 113. The light-emitting element 110B includes a pixel electrode 111B, an organic layer 112B, the organic layer 114, and the common electrode 113. The organic layer 114 and the common electrode 113 are shared by the light-emitting element 110R, the light-emitting element 110G, and the light-emitting element 110B. The organic layer 114 can also be referred to as a common layer.

The organic layer 112R of the light-emitting element 110R contains at least a light-emitting organic compound emitting red light. The organic layer 112G of the light-emitting element 110G contains at least a light-emitting organic compound emitting green light. The organic layer 112B of the light-emitting element 110B contains at least a light-emitting organic compound emitting blue light. The organic layer 112R, the organic layer 112G, and the organic layer 112B can each be referred to as a light-emitting layer.

Hereafter, the term "light-emitting element 110" is sometimes used to describe matters common to the light-emitting elements 110R, 110G, and 110B. Likewise, in the description of matters common to the components that are distinguished using alphabets, such as the organic layers 112R, 112G, and 112B, reference numerals without such alphabets are sometimes used.

The organic layer 112 and the organic layer 114 can each independently include one or more of an electron-injection layer, an electron-transport layer, a hole-injection layer, and a hole-transport layer. For example, the organic layer 112 can include a hole-injection layer, a hole-transport layer, a light-emitting layer, and an electron-transport layer that are stacked from the pixel electrode 111 side, and the organic layer 114 can include an electron-injection layer.

Note that the "organic layer" positioned between a pair of electrodes of a light-emitting element, such as the organic layer 112 or the organic layer 114, means a "layer that constitutes an organic EL element" and does not necessarily contain an organic compound. For example, the organic layer 114 may be formed using a film not containing an organic compound but containing only an inorganic compound or an inorganic substance.

The pixel electrode 111R, the pixel electrode 111G, and the pixel electrode 111B are provided for the respective light-emitting elements. The common electrode 113 and the organic layer 114 are each one continuous layer shared by the light-emitting elements. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display device is obtained. When the respective pixel electrodes are reflective electrodes and the common electrode 113 is a light-transmitting electrode, a top-emission display device is obtained. Note that when both the respective pixel electrodes and the common electrode 113 transmit light, a dual-emission display device can be obtained.

A protective layer 121 is provided over the common electrode 113 so as to cover the light-emitting elements 110R, 110G, and 110B. The protective layer 121 has a function of preventing diffusion of impurities such as water into each light-emitting element from above.

The pixel electrode 111 preferably has an end portion with a tapered shape. In the case where the pixel electrode has an end portion with a tapered shape, a portion of the organic layer 112 that is provided along a side surface of the pixel electrode also has a tapered shape. When the side surface of the pixel electrode is tapered, coverage with an EL layer provided along the side surface of the pixel electrode can be improved. The side surface of the pixel electrode having such a tapered shape is preferred because it allows a foreign matter (such as dust or particles) mixing during the manufacturing process to be easily removed by treatment such as cleaning.

In this specification and the like, a tapered shape indicates a shape in which at least part of a side surface of a structure is inclined to a substrate surface. For example, a tapered shape preferably includes a region where the angle between the inclined side surface and the substrate surface (such an angle is also referred to as a taper angle) is less than 90°.

The organic layer 112 has an island shape as a result of processing by photolithography. Thus, the angle formed between a top surface and a side surface of an end portion of the organic layer 112 is approximately 90°. By contrast, an organic film formed using a fine metal mask (FMM) or the like has a thickness that tends to gradually decrease with decreasing distance to an end portion, and has a top surface forming a slope in an area extending greater than or equal to 1 μm and less than or equal to 10 μm from the end portion, for example; thus, such an organic film has a shape whose top surface and side surface cannot be easily distinguished from each other.

Between two adjacent light-emitting elements, a side surface of the organic layer 112 of one light-emitting element faces a side surface of the organic layer 112 of the other light-emitting element with a resin layer 126 between the side surfaces. The resin layer 126 is positioned between two adjacent light-emitting elements so as to fill the region between the end portions of their organic layers 112 and the region between the two organic layers 112. The resin layer 126 has a top surface with a smooth convex shape. The top surface of the resin layer 126 is covered with the organic layer 114 and the common electrode 113.

The resin layer 126 preferably contains a material absorbing visible light. For example, the resin layer 126 itself may be made of a material absorbing visible light, or the resin layer 126 may contain a pigment absorbing visible light. For example, the resin layer 126 can be formed using a resin that can be used as a color filter transmitting red, blue, or green light and absorbing light of the other colors; or a resin that contains carbon black as a pigment and serves as a black matrix.

It is preferable that the top surface of the resin layer 126 have a portion that is at a level higher than the level of a top surface of each light-emitting element 110. Specifically, it is preferable that the top surface of the resin layer 126 have a portion that is at a level higher than the level of a top surface of the common electrode 113 in a region not covered with the resin layer 126. This structure enables absorbing the light that is emitted obliquely upward from the light-emitting element 110, more effectively reducing the influence of stray light.

An insulating layer 125 is provided to be in contact with the side surface of the organic layer 112. The insulating layer 125 is positioned between the resin layer 126 and the organic layer 112 to serve as a protective film for preventing contact between the resin layer 126 and the organic layer 112. In the case of bringing the resin layer 126 into contact with the organic layer 112, the organic layer 112 might be dissolved by an organic solvent or the like used in formation of the resin layer 126. In view of this, the insulating layer 125 is provided between the organic layer 112 and the resin layer 126 as described in this embodiment to protect the side surface of the organic layer.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is used for the insulating layer 125, the insulating layer 125 has a small number of pin holes and excels in a function of protecting the EL layer.

Note that in this specification and the like, an oxynitride refers to a material in which an oxygen content is higher than a nitrogen content, and a nitride oxide refers to a material in which a nitrogen content is higher than an oxygen content. For example, silicon oxynitride refers to a material in which an oxygen content is higher than a nitrogen content, and silicon nitride oxide refers to a material in which a nitrogen content is higher than an oxygen content.

The insulating layer 125 can be formed by a sputtering method, a CVD method, a PLD method, an ALD method, or the like. The insulating layer 125 is preferably formed by an ALD method achieving good coverage.

An insulating layer including an organic material can be favorably used as the resin layer 126. Examples of materials used for the resin layer 126 include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. The resin layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

A photosensitive resin can also be used for the resin layer 126. A photoresist may be used for the photosensitive resin. As the photosensitive resin, a positive photosensitive material or a negative photosensitive material can be used.

Between the insulating layer 125 and the resin layer 126, a reflective film (e.g., a metal film containing one or more of silver, palladium, copper, titanium, aluminum, and the like) may be provided to reflect the light that is emitted from the light-emitting layer. In this case, the light extraction efficiency can be increased.

As shown in FIG. 1B, an insulating layer 128 may be provided between the insulating layer 125 and a top surface of the organic layer 112. Part of a protective layer (also referred to as a sacrificial layer) for protecting the organic layer 112 during etching of the organic layer 112 survives the etching to become the insulating layer 128. For the insulating layer 128, the material that can be used for the insulating layer 125 can be used. It is particularly preferable to use the same material for the insulating layer 128 and the insulating layer 125 to facilitate processing.

The protective layer 121 is covered with the common electrode 113. The protective layer 121 and a substrate 170 are bonded to each other with an adhesive layer 171.

The protective layer 121 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material or a conductive material such as indium gallium oxide, indium zinc oxide, indium tin oxide, or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, since a top surface of the protective layer 121 is flat, a preferable effect can be obtained; when a component (e.g., a color filter, an electrode of a touch sensor, a lens array, or the like) is provided above the protective layer 121, the component is less affected by an uneven shape caused by the lower structure.

FIG. 1C illustrates a connection portion 140 in which the connection electrode 111C is electrically connected to the common electrode 113. In the connection portion 140, an opening portion is provided in the insulating layer 125 and the resin layer 126 over the connection electrode 111C. In the opening portion, the connection electrode 111C and the common electrode 113 are electrically connected to each other.

Although FIG. 1C illustrates the connection portion 140 in which the connection electrode 111C and the common electrode 113 are electrically connected to each other, the common electrode 113 may be provided over the connection electrode 111C with the organic layer 114 therebetween. Particularly in the case of the organic layer 114 that includes a carrier-injection layer, for example, the organic layer 114 can be formed to be thin using a material with sufficiently low electrical resistivity and thus can be in the connection portion 140 almost without causing any problem. Accordingly, the common electrode 113 and the organic layer 114 can be formed using the same shielding mask, whereby manufacturing costs can be reduced.

Structure examples of a display device partly different from the above structure example are described below. In the following description, portions similar to those in Structure example 1 are denoted by the same reference numerals as those in Structure example 1, and the description thereof is not repeated in some cases.

Structure Example 2

Figure 2A:
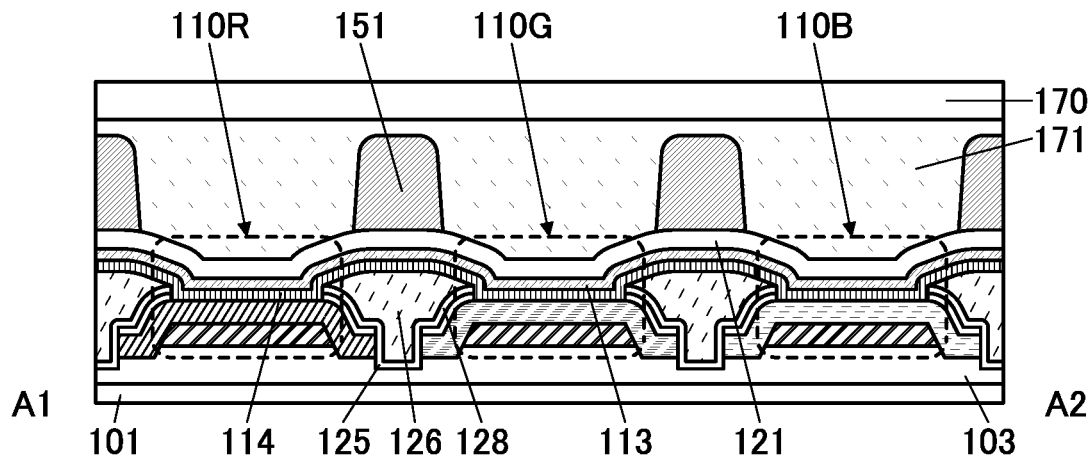
FIGS. 2A and 2B illustrate structure examples of display devices.

FIG. 2A is a schematic cross-sectional view of a display device 100A. Main differences between the display device 100A and the display device in Structure example 1 are the shape of the resin layer 126 and a light-blocking layer 151 included only in the display device 100A. For a top view of the display device 100A, FIG. 1A can be referred to.

The light-blocking layer 151 is provided over the protective layer 121. The light-blocking layer 151 is provided to overlap with the resin layer 126 with the protective layer 121, the common electrode 113, and the organic layer 114 between the light-blocking layer 151 and the resin layer 126. This structure can effectively suppress the influence of stray light without compromising the aperture ratio.

The light-blocking layer 151 has a function of absorbing visible light or a function of reflecting visible light. In the case where a material absorbing visible light is used for the light-blocking layer 151, the light-blocking layer 151 can be formed using a material similar to the material that can be used for the resin layer 126 described above. In the case where a material reflecting visible light is used for the light-blocking layer 151, the light-blocking layer 151 can be formed using a reflective metal or a reflective alloy, for example. Alternatively, the light-blocking layer can be an insulating layer covered with the metal or the alloy.

The height of the light-blocking layer 151 is preferably as large as possible, and its top surface is preferably as close to a bottom surface of the substrate 170 as possible. The height of the light-blocking layer 151 is larger than or equal to 50%, preferably larger than or equal to 60%, further preferably larger than or equal to 70%, still further preferably larger than or equal to 80% of the thickness of the adhesive layer 171, and smaller than or equal to 100% of the thickness of the adhesive layer 171. The larger the height of the light-blocking layer 151 is, the more the stray light guided in the adhesive layer 171 can be blocked.

Figure 2B:
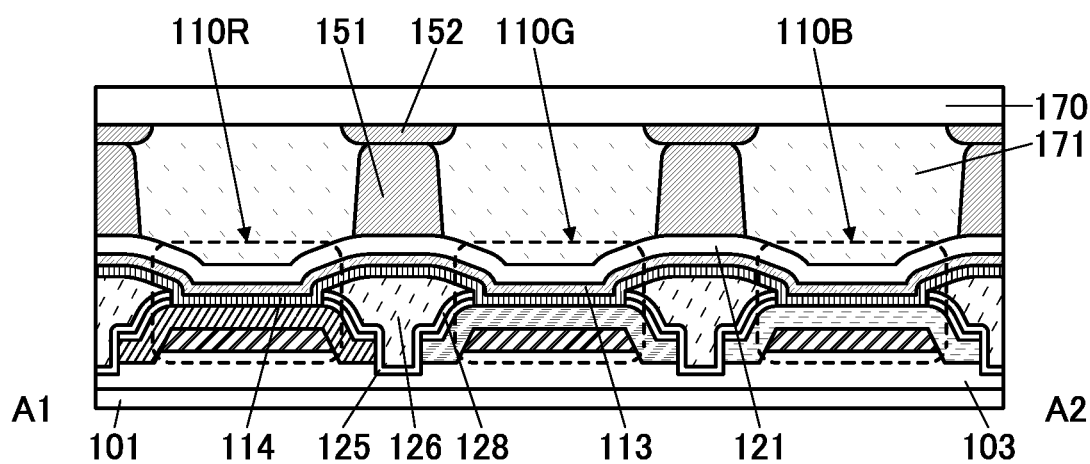

FIG. 2B illustrates a modification example of the display device 100A. In FIG. 2B, a light-blocking layer 152 is provided in addition to the light-blocking layer 151.

The light-blocking layer 152 is formed on the substrate 170 side. For the light-blocking layer 152, a material similar to that of the light-blocking layer 151 can be used. The light-blocking layer 152 is preferably a material that absorbs visible light.

In the example shown in FIG. 2B, the top surface of the light-blocking layer 151 is in contact with a bottom surface of the light-blocking layer 152. As a result, an isolated adhesive layer 171 having a columnar shape is provided over each light-emitting element 110. This structure prevents the light emitted from the light-emitting element 110 and guided by the adhesive layer 171 from leaking to an adjacent light-emitting element 110 side, thereby effectively suppressing the influence of stray light.

Note that the light-blocking layer 151 and the light-blocking layer 152 are not necessarily in contact with each other. In that case, the light-blocking layer 151 and the light-blocking layer 152 may overlap with each other with the adhesive layer 171 therebetween.

Structure Example 3

Figure 3A:
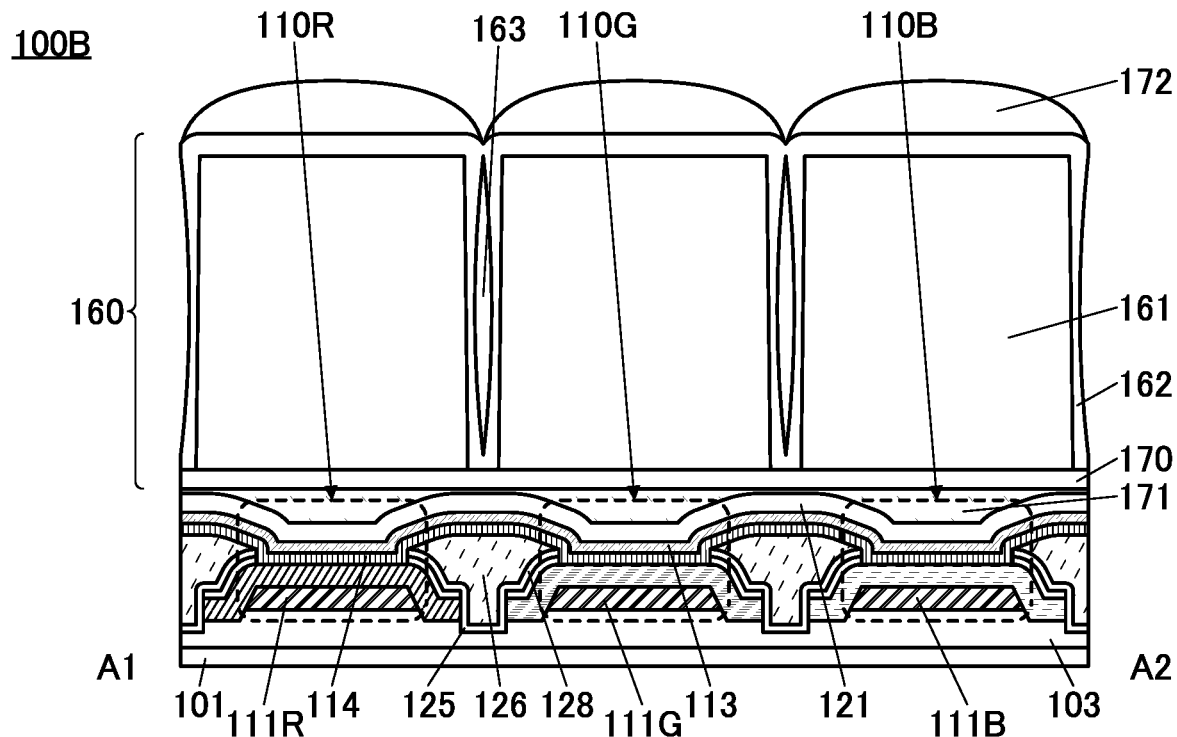
FIGS. 3A and 3B illustrate structure examples of display devices.

FIG. 3A is a schematic cross-sectional view of a display device 100B. The display device 100B includes a light-guiding layer 160.

The light-guiding layer 160 includes a light-guiding portion 161, a layer 162, and a cavity 163 over the substrate 170. The cavity 163 functions as a reflecting portion for reflecting visible light. The light-guiding layer 160 preferably includes a lens 172. A layer including a plurality of lenses 172 can referred to as a lens array or a lens layer.

The light-guiding portion 161 has a columnar shape and is provided in a region overlapping with the pixel electrode 111 (the pixel electrode 111R, 111G, or 111B) of each light-emitting element. The layer 162 is provided to cover a side surface and a top surface of the light-guiding portion 161 having the columnar shape. The layer 162 is provided such that it covers the side surface of the columnar light-guiding portion 161 and a top surface of the substrate 170. The layers 162 covering upper end portions of two adjacent light-guiding portions 161 are in contact with each other, whereby the cavity 163 surrounded by the layer 162 is formed between the two light-guiding portions 161.

The cavity 163 may be filled with air or an inert gas, or the atmosphere in the cavity 163 may be a reduced-pressure atmosphere. The light-guiding portion 161 can be formed using a material with a refractive index higher than that of at least the cavity 163. The refractive index of the light-guiding portion 161 is preferably as high as possible. The layer 162 is preferably formed using a material whose refractive index is higher than that of the cavity 163 and lower than or equal to that of the light-guiding portion 161. The layer 162 preferably transmits or reflects visible light.

Over the layer 162 are provided the lenses 172 for the respective light-guiding portions 161. A region of each lens 172 overlaps with any of the light-emitting element 110R, the light-emitting element 110G, and the light-emitting element 110B with the light-guiding portion 161 positioned between the region and the light-emitting element.

Figure 3B:
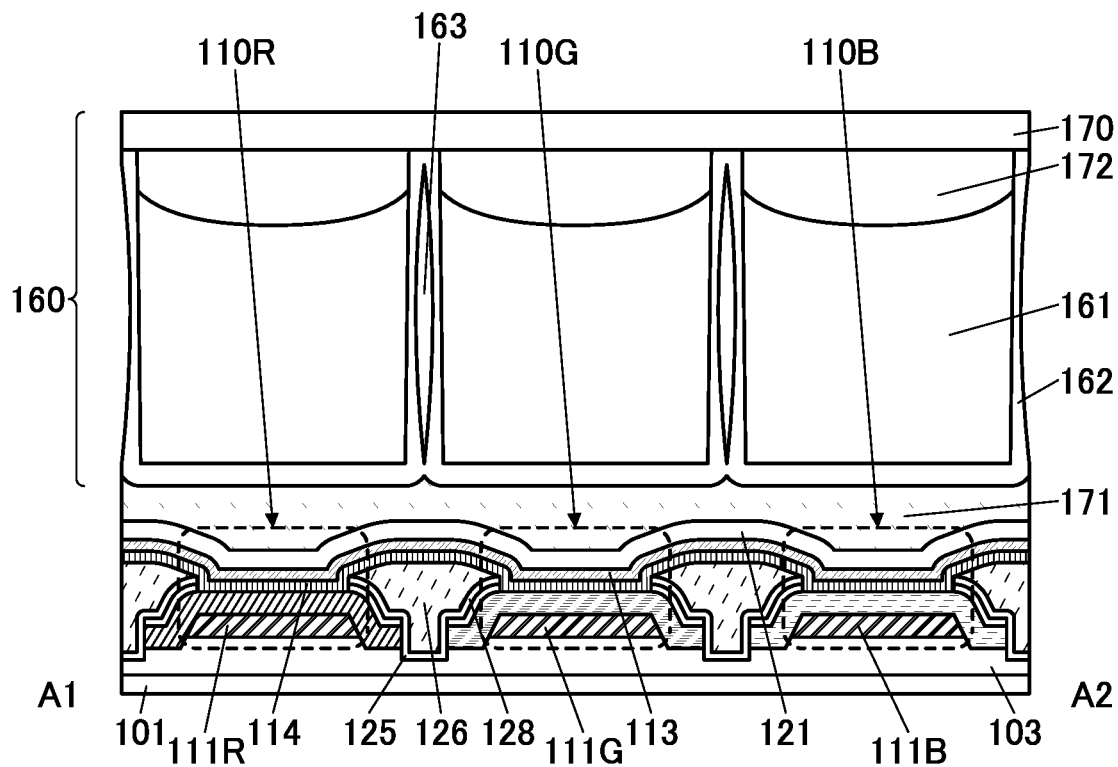

FIG. 3B illustrates a modification example of the display device 100B. The display device illustrated in FIG. 3B is different from the display device 100B in the structure of the light-guiding layer 160.

In FIG. 3B, the lens 172 and the light-guiding portion 161 are provided in this order on the surface of the substrate 170 that faces the substrate 101, and are covered with the layer 162. The layer 162 and the protective layer 121 are bonded to each other with the adhesive layer 171.

The structure shown in FIG. 3B can achieve a higher manufacturing yield because the structure can be manufactured in such a manner that the components on the substrate 101 side (e.g., the substrate 101, the protective layer 121, and the components therebetween) are formed separately from the components on the substrate 170 side (e.g., the substrate 170, the layer 162, and the components therebetween) and the substrate 101 and the substrate 170 are then bonded to each other. The components on the substrate 170 side can be formed in such a manner that, for example, a lens array is formed over the substrate 170, a light-transmitting film to be the light-guiding portion 161 is formed thereover, a groove reaching the substrate 170 is formed in the light-transmitting film and the lens array, and then, the layer 162 is formed along the inner wall of the groove.

Structure Example 4

Figure 4A:
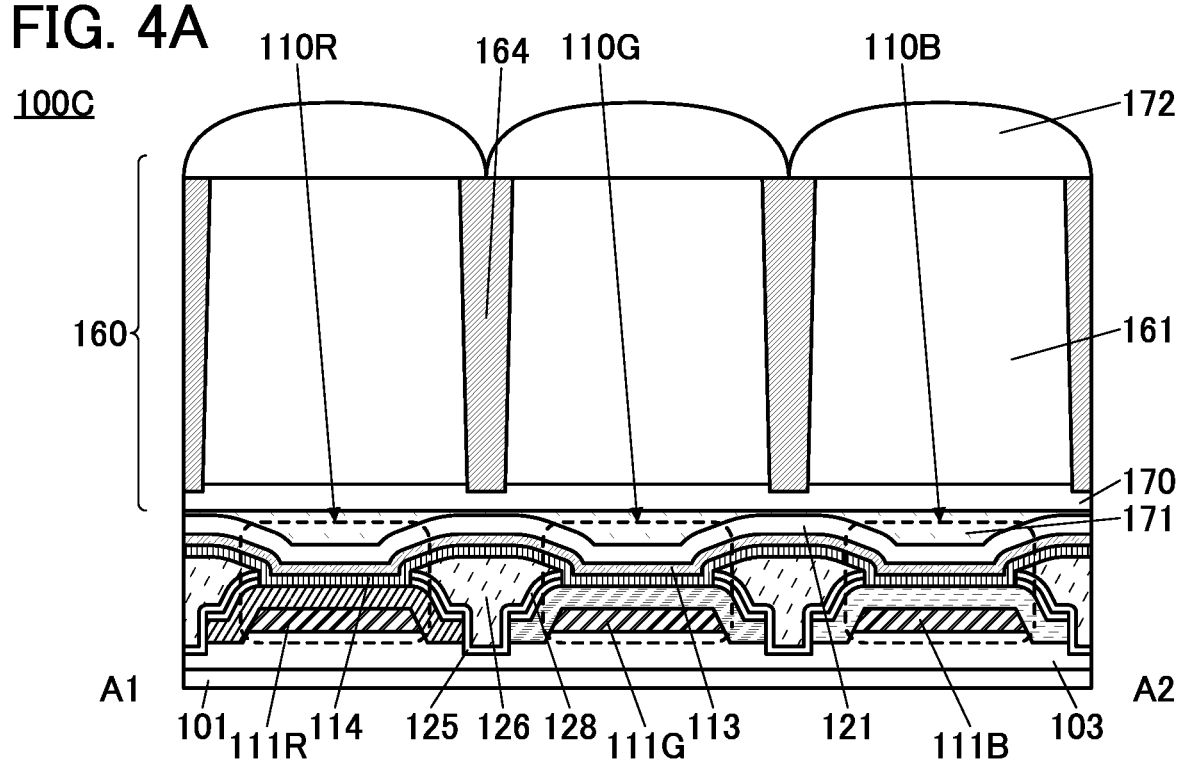
FIGS. 4A and 4B illustrate structure examples of display devices.

FIG. 4A is a schematic cross-sectional view of a display device 100C. The display device 100C is different from the display device 100B mainly in the structure of the light-guiding layer 160.

In the display device 100C, a reflective layer 164 is provided instead of the layer 162 and the cavity 163 of the display device 100B.

The reflective layer 164 reflects visible light. The reflective layer 164 can be a structure body containing a reflective metal or a reflective alloy, or a structure body covered with the metal or the alloy. For example, the reflective layer 164 can be formed in such a manner that a metal layer is embedded to cover the side surface of the columnar light-guiding portion 161. In this case, the reflective layer 164 at least covers the side surface of the light-guiding portion 161 and is not necessarily embedded in the gap between the adjacent light-guiding portions 161.

Figure 4B:
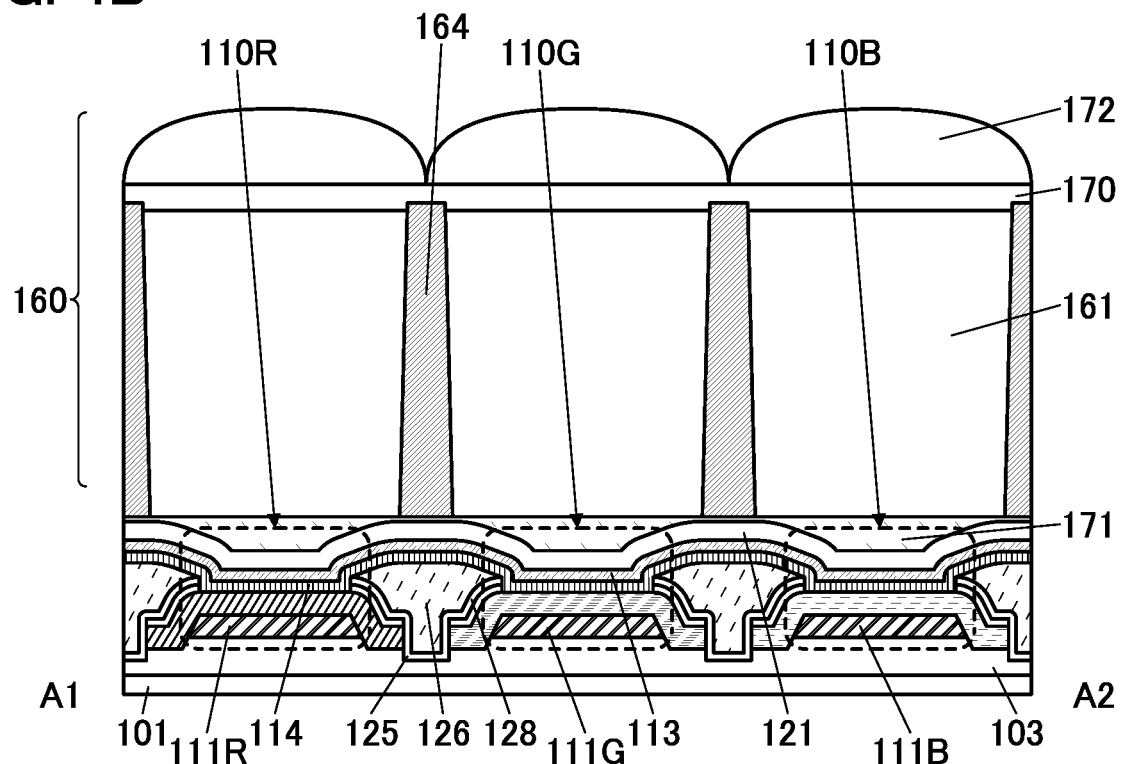

FIG. 4B illustrates a modification example of the display device 100C. In the example illustrated in FIG. 4B, the light-guiding layer 160 in the display device 100C is inverted vertically. The lens 172 is placed across the substrate 170 from the light-guiding portion 161 in this example; however, the lens 172 may be placed on the light-guiding portion 161 side as in FIG. 3B.

The above is the description of Structure examples 1 to 4.

Modification Example

In the above description, the light-emitting elements emitting light of different colors are separately formed. A description is given below of exemplary display devices that are capable of performing full-color display by combining color filters (also referred to as coloring layers) with a plurality of light-emitting elements emitting white light.

Figure 5A:
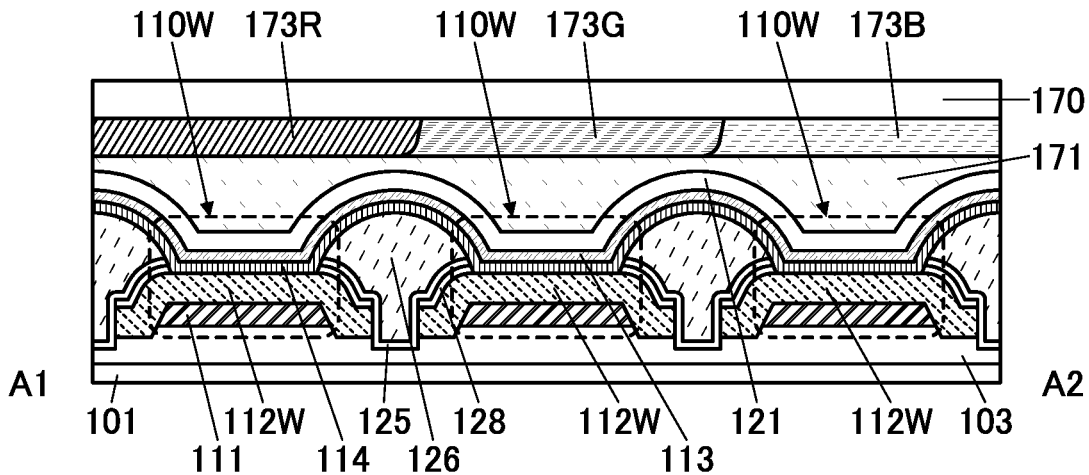
FIGS. 5A and 5B illustrate structure examples of display devices.

FIG. 5A shows a display device that is different from the display device with the structure shown in FIG. 1B in including white-light-emitting elements and coloring layers.

The display device in FIG. 5A includes a plurality of light-emitting elements 110W. The light-emitting elements 110W each include an organic layer 112W exhibiting white light emission. The substrate 170 is provided with a coloring layer 173R transmitting red light, a coloring layer 173G transmitting green light, and a coloring layer 173B transmitting blue light. Of the white light emitted by the light-emitting element 110W, light with wavelengths in a predetermined wavelength region is absorbed by the coloring layer 173R, 173G, or 173B, whereby the white light is colored and the colored light is emitted to the outside through the substrate 170.

Although the coloring layer 173 is provided on the substrate 170 side here, the coloring layer 173 may be provided over the protective layer 121.

Figure 5B:
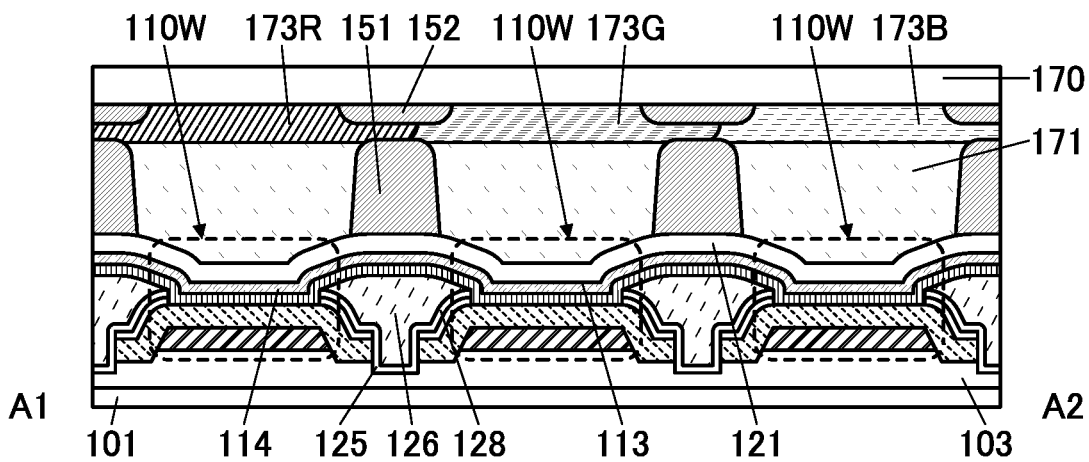

FIG. 5B illustrates an example in which the above structure shown in FIG. 2B includes white-light-emitting elements and color filters.

The coloring layer 173 is provided on the substrate 170 side in a manner similar to that of the light-blocking layer 152. The coloring layer 173 preferably has a region overlapping with the light-blocking layer 151 and the light-blocking layer 152. In the example shown in FIG. 5B, the coloring layer 173 has a portion positioned between the light-blocking layer 151 and the light-blocking layer 152.

Figure 6A:
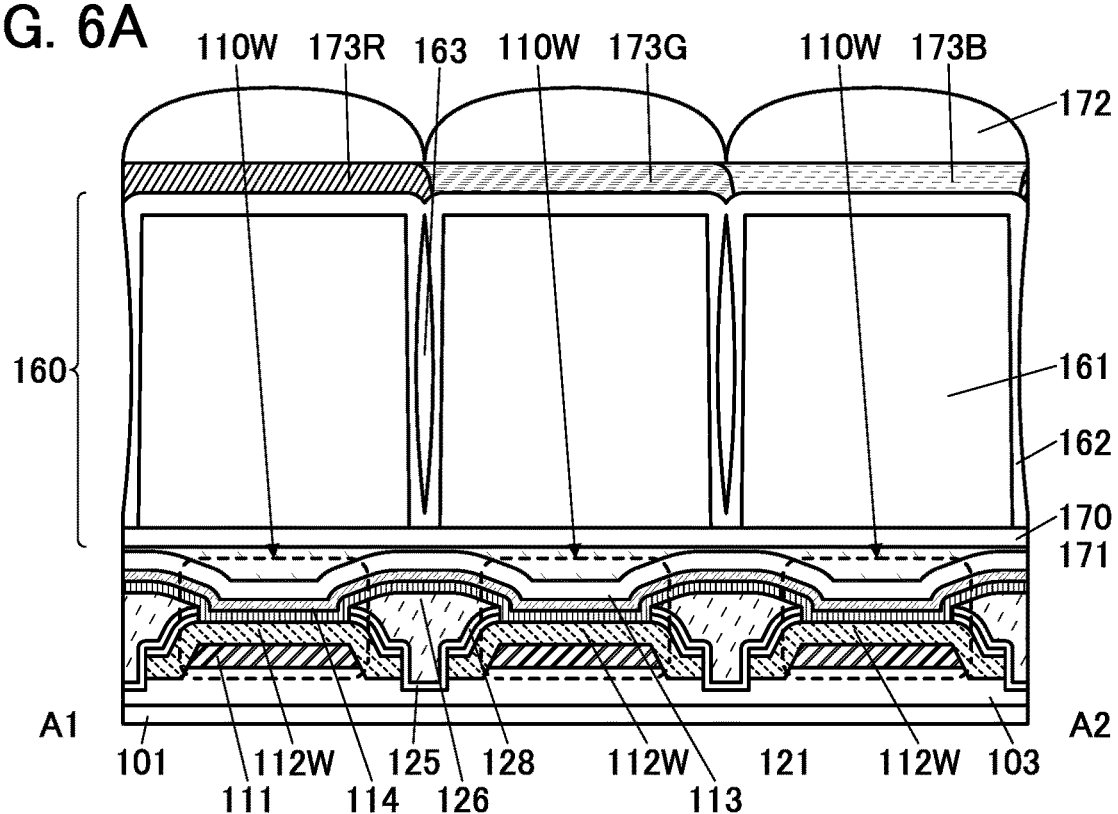
FIGS. 6A and 6B illustrate structure examples of display devices.
Figure 6B:
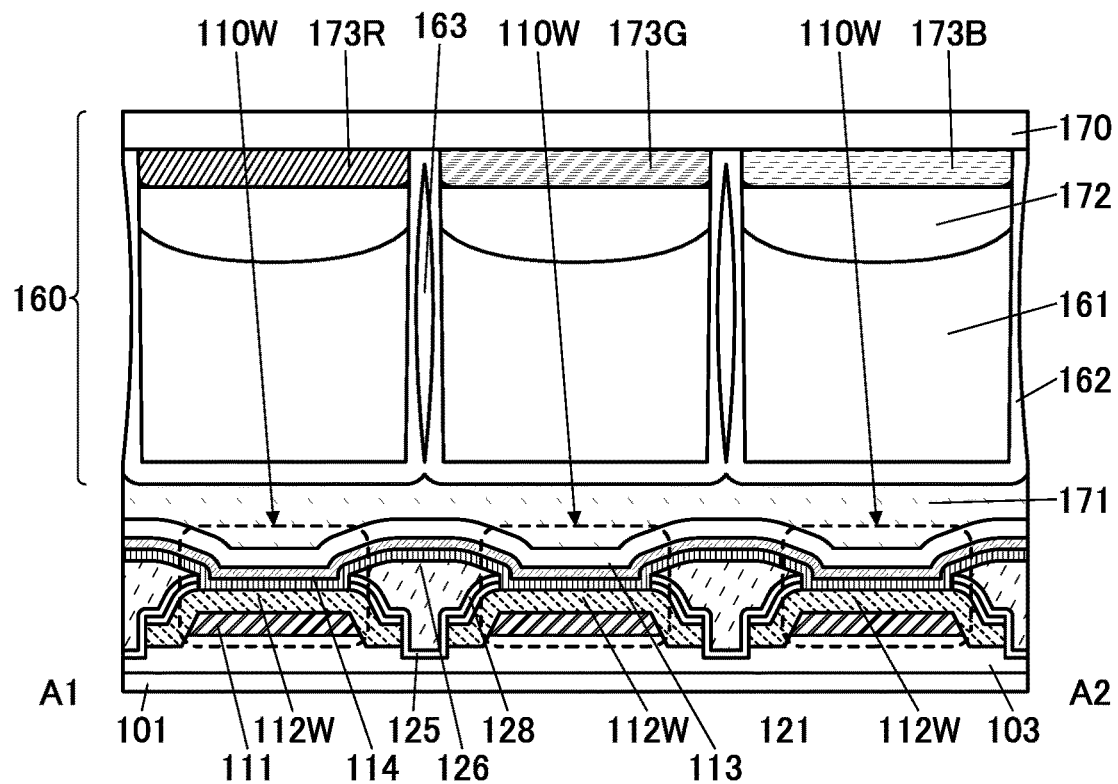

FIGS. 6A and 6B respectively illustrate examples in which the structures in FIGS. 3A and 3B include white-light-emitting elements and color filters.

In FIG. 6A, the coloring layer 173 is provided between the layer 162 and the lens 172. In FIG. 6B, the coloring layer 173 is provided between the substrate 170 and the lens 172.

The above is the description of the modification examples.

In the above exemplary display devices, a decrease in contrast due to stray light is inhibited along with crosstalk due to leakage current, allowing the display devices to display images having extremely high quality. Moreover, both a high aperture ratio and high resolution can be achieved. This enables favorable use of the display devices in microdisplays for head-mounted displays. Note that the applications of one embodiment of the present invention are not particularly limited and can range from microdisplays that are less than one inch in size to ultra-large displays that are more than 100 inches in size.

[Light-Emitting Element]

Next, materials that can be used for a light-emitting element (also referred to as a light-emitting device) are described.

A conductive film that transmits visible light is used as the electrode through which light is extracted, which is either the pixel electrode or the common electrode. A conductive film that reflects visible light is preferably used as the electrode through which light is not extracted. In the case where a display device includes a light-emitting element emitting infrared light, a conductive film which transmits visible light and infrared light is used as the electrode through which light is extracted, and a conductive film that reflects visible light and infrared light is preferably used as the electrode through which light is not extracted.

A conductive film that transmits visible light may be used also for the electrode through which light is not extracted. In that case, this electrode is preferably provided between the reflective layer and the EL layer. In other words, light emitted by the EL layer may be reflected by the reflective layer to be extracted from the display device.

For the pair of electrodes (the pixel electrode and the common electrode) of the light-emitting element, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting element preferably employs a microcavity structure. Therefore, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between the electrodes, whereby light emitted from the light-emitting element can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with wavelengths greater than or equal to 400 nm and less than 750 nm) transmittance higher than or equal to 40% is preferably used in the light-emitting element. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity lower than or equal to $1\times10^{-2}$ $\Omega$cm.

The light-emitting layer contains a light-emitting material (also referred to as a light-emitting substance). The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As the one or more kinds of organic compounds, one or both of a hole-transport material and an electron-transport material can be used. Alternatively, as the one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with a wavelength of a lowest-energy-side absorption band of the light-emitting substance, energy can be transferred smoothly and light emission can be obtained efficiently. With the above structure, high efficiency, low-voltage driving, and a long lifetime of the light-emitting element can be achieved at the same time.

In addition to the light-emitting layer, the organic layer 112R, the organic layer 112G, and the organic layer 112B may also include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used in the light-emitting element, and an inorganic compound may also be included. Each layer included in the light-emitting element can be formed by any of the following methods: an evaporation method (including a vacuum evaporation method), a transfer method, a printing method, an inkjet method, a coating method, and the like.

For example, the organic layer 112R, the organic layer 112G, and the organic layer 112B may each include one or more of a hole-injection layer, a hole-transport layer, a hole-blocking layer, an electron-blocking layer, an electron-transport layer, and an electron-injection layer.

One or more of a hole-injection layer, a hole-transport layer, a hole-blocking layer, an electron-blocking layer, an electron-transport layer, and an electron-injection layer can be used as the organic layer 114 that is the common layer. For example, a carrier-injection layer (a hole-injection layer or an electron-injection layer) may be formed as the organic layer 114. Note that the light-emitting element does not necessarily include the organic layer 114.

The organic layer 112R, the organic layer 112G, and the organic layer 112B each preferably include a light-emitting layer and a carrier-transport layer over the light-emitting layer. Accordingly, the light-emitting layer is prevented from being exposed on the outermost surface in the process of manufacturing the display device, so that damage to the light-emitting layer can be reduced. Thus, the reliability of the light-emitting element can be increased.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material. The hole-transport material preferably has a hole mobility higher than or equal to $1\times10^{-6}$ cm$^2$/Vs. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility higher than or equal to $1\times10^{-6}$ cm$^2$/Vs. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where x is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to $-3.6$ eV and less than or equal to $-2.3$ eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), 2,2-(1,3-phenylene)bis[9-phenyl-1,10-phenanthroline] (abbreviation: mPPhen2P), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

In the case of manufacturing a tandem light-emitting element, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For example, the charge-generation layer can be favorably formed using a material that can be used for the electron-injection layer, such as lithium. For another example, the charge-generation layer can be favorably formed using a material that can be used for the hole-injection layer. Moreover, the charge-generation layer can be a layer containing a hole-transport material and an acceptor material (electron-accepting material). The charge-generation layer can be a layer containing an electron-transport material and a donor material. Forming such a charge-generation layer can suppress an increase in the driving voltage that would be caused when the light-emitting units are stacked.

[Method for Manufacturing Display Device]

Thin films included in the display device (e.g., insulating films, semiconductor films, and conductive films) can be formed by a sputtering method, a chemical vapor deposition (CVD) method, a vacuum evaporation method, a pulsed laser deposition (PLD) method, an ALD method, or the like. Examples of a CVD method include a plasma-enhanced CVD (PECVD) method and a thermal CVD method. An example of a thermal CVD method is a metal organic CVD (MOCVD) method.

Alternatively, the thin films included in the display device (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for fabrication of the light-emitting element, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

The thin films included in the display device can be processed by a photolithography method or the like. Alternatively, the thin films may be processed by a nanoimprinting method, a sandblasting method, a lift-off method, or the like. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the K-line are mixed. Alternatively, ultraviolet light, KrF laser light, ArF laser light, or the like can be used. Exposure may be performed by a liquid immersion exposure technique. As the light for exposure, extreme ultraviolet (EUV) light or X-rays may also be used. Furthermore, instead of the light used for the exposure, an electron beam can also be used. It is preferable to use EUV light, X-rays, or an electron beam because they enable extremely minute processing. Note that a photomask is not needed when exposure is performed by scanning with a beam such as an electron beam.

For etching of the thin films, a dry etching method, a wet etching method, a sandblast method, or the like can be used.

[Pixel Layout]

Pixel layouts different from those in FIG. 1A are mainly described below. There is no particular limitation on the arrangement of the light-emitting elements (subpixels), and a variety of methods can be employed.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting element.

The pixel 150 illustrated in FIG. 7A employs S-stripe arrangement. The pixel 150 in FIG. 7A consists of three subpixels: light-emitting elements 110a, 110b, and 110c. For example, the light-emitting element 110a may be a blue-light-emitting element B, the light-emitting element 110b may be a red-light-emitting element R, and the light-emitting element 110c may be a green-light-emitting element G as shown in FIG. 8A.

The pixel 150 illustrated in FIG. 7B includes the light-emitting element 110a whose top surface has a rough trapezoidal shape with rounded corners, the light-emitting element 110b whose top surface has a rough triangle shape with rounded corners, and the light-emitting element 110c whose top surface has a rough tetragonal or rough hexagonal shape with rounded corners. The light-emitting element 110a has a larger light-emitting area than the light-emitting element 110b. In this manner, the shapes and sizes of the light-emitting elements can be determined independently. For example, the size of a light-emitting element with higher reliability can be smaller. For example, the light-emitting element 110a may be a green-light-emitting element G, the light-emitting element 110b may be a red-light-emitting element R, and the light-emitting element 110c may be a blue-light-emitting element B as shown in FIG. 8B.

Pixels 124a and 124b illustrated in FIG. 7C employ PenTile arrangement. FIG. 7C illustrates an example in which the pixels 124a including the light-emitting elements 110a and 110b and the pixels 124b including the light-emitting elements 110b and 110c are alternately arranged. For example, the light-emitting element 110a may be a red-light-emitting element R, the light-emitting element 110b may be a green-light-emitting element G, and the light-emitting element 110c may be a blue-light-emitting element B as shown in FIG. 8C.

The pixels 124a and 124b illustrated in FIGS. 7D and 7E employ delta arrangement. The pixel 124a includes two light-emitting elements (the light-emitting elements 110a and 110b) in the upper row (first row) and one light-emitting element (the light-emitting element 110c) in the lower row (second row). The pixel 124b includes one light-emitting element (the light-emitting element 110c) in the upper row (first row) and two light-emitting elements (the light-emitting elements 110a and 110b) in the lower row (second row). For example, the light-emitting element 110a may be a red-light-emitting element R, the light-emitting element 110b may be a green-light-emitting element G, and the light-emitting element 110c may be a blue-light-emitting element B as shown in FIG. 8D.

FIG. 7D shows an example where the top surface of each light-emitting element has a rough tetragonal shape with rounded corners, and FIG. 7E shows an example where the top surface of each light-emitting element is circular.

FIG. 7F shows an example where light-emitting elements of different colors are arranged in a zigzag manner. Specifically, the positions of the top sides of two light-emitting elements arranged in the column direction (e.g., the light-emitting element 110a and the light-emitting element 110b or the light-emitting element 110b and the light-emitting element 110c) are not aligned in the top view. For example, the light-emitting element 110a may be a red-light-emitting element R, the light-emitting element 110b may be a green-light-emitting element G, and the light-emitting element 110c may be a blue-light-emitting element B as shown in FIG. 8E.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface of a light-emitting element may have a polygonal shape with rounded corners, an elliptical shape, a circular shape, or the like.

Furthermore, in the method for manufacturing the display device of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, a top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

Note that also in the pixel 150 in FIG. 1A, which employs stripe arrangement, the light-emitting element 110a can be a red-light-emitting element R, the light-emitting element 110b can be a green-light-emitting element G, and the light-emitting element 110c can be a blue-light-emitting element B as shown in FIG. 8F, for example.

The above is the description of the pixel layouts.

At least part of this embodiment can be implemented in combination with any of the other embodiments described in this specification, as appropriate.

Embodiment 2

In this embodiment, display panels of embodiments of the present invention are described with reference to the drawings.

The display panel of this embodiment can be a high-resolution display panel. Accordingly, the display panel of this embodiment can be used for display portions of information terminals (wearable devices) such as watch-type and bracelet-type information terminals and display portions of wearable devices capable of being worn on the head, such as a VR device like a head-mounted display and a glasses-type AR device.

The display panel of this embodiment can be a high-definition display panel or a large-sized display panel.

Accordingly, the display panel of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Module]

Figure 9A:
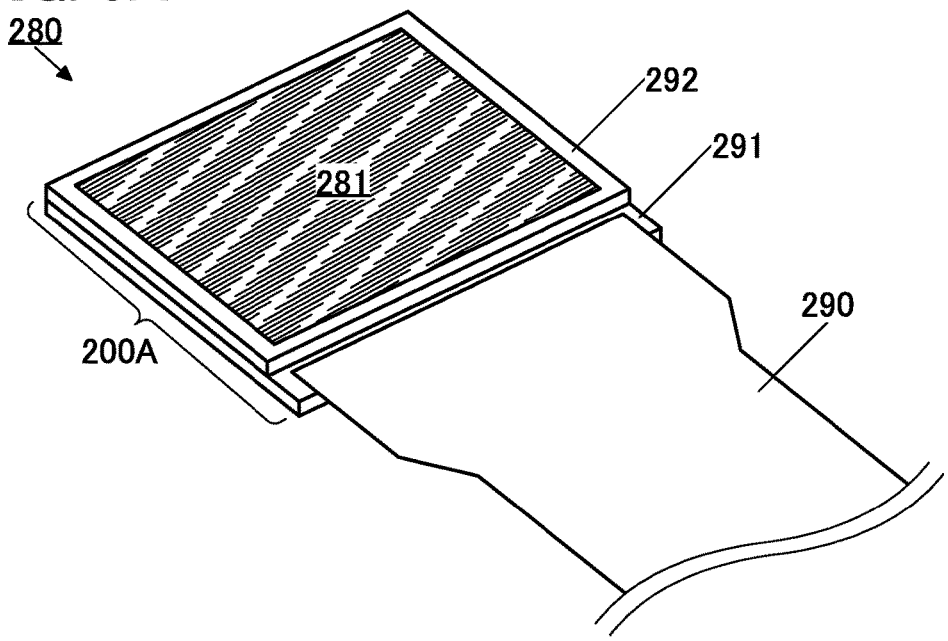
FIGS. 9A and 9B are perspective views illustrating an example of a display panel.

FIG. 9A is a perspective view of a display module 280. The display module 280 includes a display panel 200A and an FPC 290. Note that the display panel included in the display module 280 is not limited to the display panel 200A and may be any of display panels 200B to 200F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 9B:
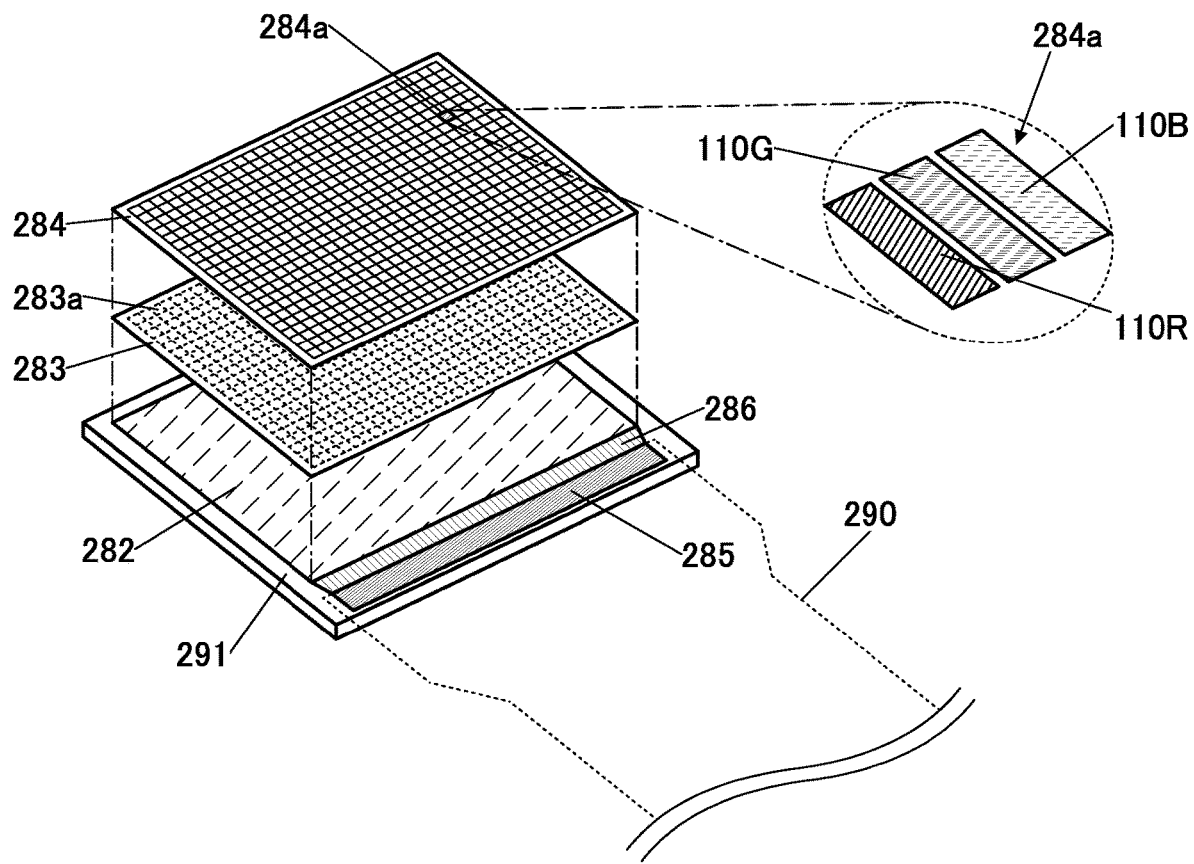

FIG. 9B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 9B. The pixel 284a includes the light-emitting element 110R emitting red light, the light-emitting element 110G emitting green light, and the light-emitting element 110B emitting blue light.

The pixel circuit portion 283 includes a plurality of pixel circuits 283a arranged periodically.

One pixel circuit 283a is a circuit that controls light emission of three light-emitting devices included in one pixel 284a. One pixel circuit 283a may be provided with three circuits each of which controls light emission of one light-emitting device. For example, the pixel circuit 283a can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display panel is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like. A transistor included in the circuit portion 282 may constitute part of the pixel circuit 283a. That is, the pixel circuit 283a may be constituted by a transistor included in the pixel circuit portion 283 and a transistor included in the circuit portion 282.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high level of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Panel 200A]

Figure 10:
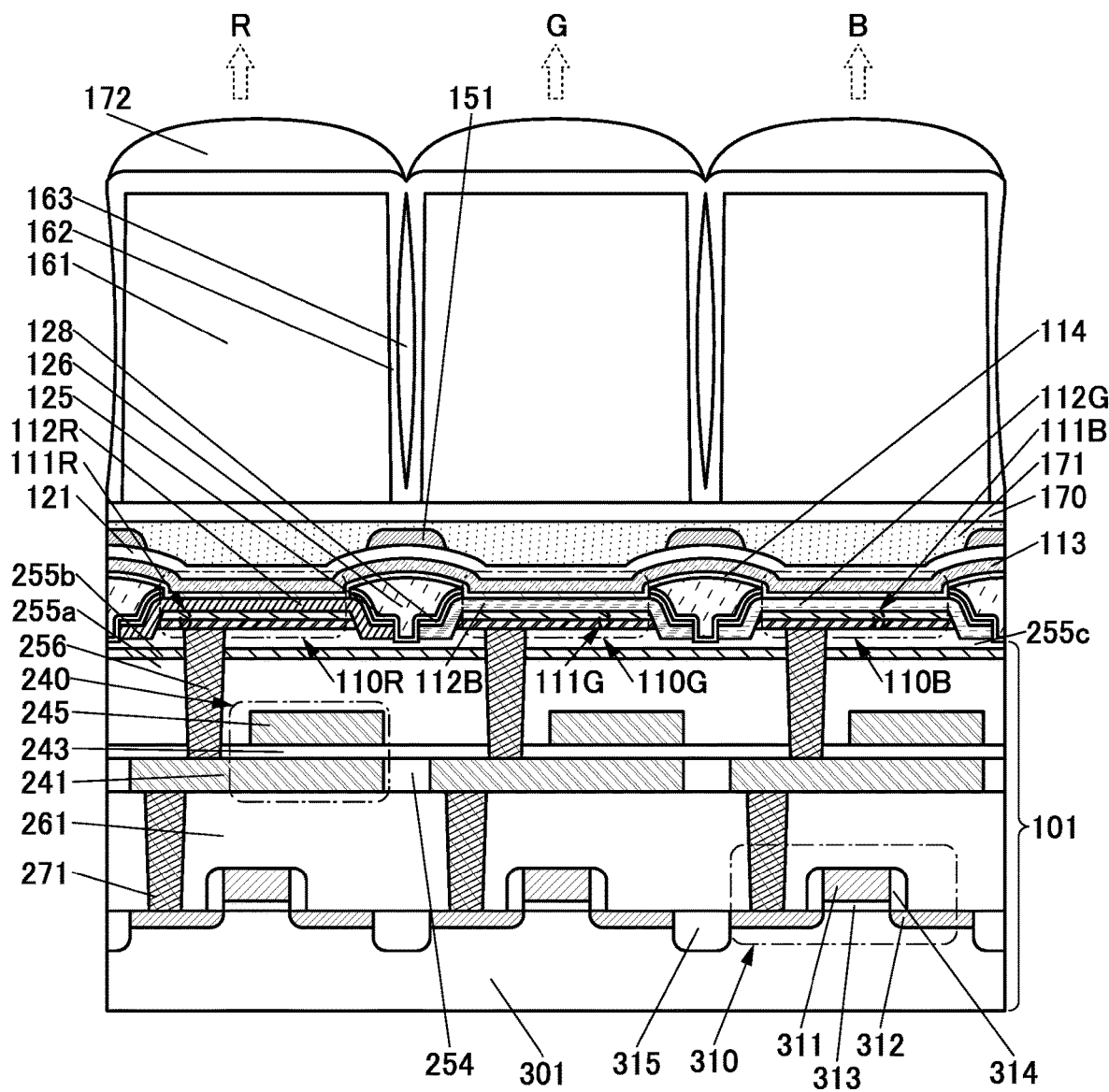
FIG. 10 is a cross-sectional view illustrating an example of a display device.

The display panel 200A illustrated in FIG. 10 includes a substrate 301, the light-emitting elements 110R, 110G, and 110B, a capacitor 240, and a transistor 310.

The substrate 301 corresponds to the substrate 291 illustrated in FIGS. 9A and 9B.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255a is provided to cover the capacitor 240, an insulating layer 255b is provided over the insulating layer 255a, and an insulating layer 255c is provided over the insulating layer 255b.

As each of the insulating layers 255a, 255b, and 255c, any of a variety of inorganic insulating films such as an oxide insulating film, a nitride insulating film, an oxynitride insulating film, and a nitride oxide insulating film can be suitably used. As the insulating layers 255a and 255c, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferred that a silicon oxide film be used as the insulating layer layers 255a and 255c and a silicon nitride film be used as the insulating layer 255b. The insulating layer 255b preferably has a function of an etching protective film. Although this embodiment shows an example in which a depression is provided in the insulating layer 255c, a depression is not necessarily provided in the insulating layer 255c.

The light-emitting element 110R, the light-emitting element 110G, and the light-emitting element 110B are provided over the insulating layer 255c. Embodiment 1 can be referred to for the structures of the light-emitting element 110R, the light-emitting element 110G, and the light-emitting element 110B.

In the display panel 200A, since the light-emitting devices of different colors are separately formed, the difference between the chromaticity at low luminance emission and that at high luminance emission is small. Furthermore, since the organic layers 112R, 112G, and 112B are separated from each other, crosstalk generated between adjacent subpixels can be prevented while the display panel 200A has high resolution. Accordingly, the display panel can have high resolution and high display quality.

In the region between adjacent light-emitting elements, the insulating layer 125, the resin layer 126, and the insulating layer 128 are provided.

The pixel electrodes 111R, 111G, and 111B of the light-emitting elements are each electrically connected to one of the source and the drain of the transistor 310 through a plug 256 embedded in the insulating layers 255a, 255b, and 255c, the conductive layer 241 embedded in the insulating layer 254, and the plug 271 embedded in the insulating layer 261. A top surface of the insulating layer 255c and a top surface of the plug 256 are level with or substantially level with each other. Any of a variety of conductive materials can be used for the plugs.

The protective layer 121 is provided over the light-emitting elements 110R, 110G, and 110B. The substrate 170 is bonded above the protective layer 121 with the adhesive layer 171. Furthermore, the light-blocking layer 151 is provided over the protective layer 121 to overlap with the resin layer 126.

An insulating layer covering an end portion of a top surface of the pixel electrode 111 is not provided between two adjacent pixel electrodes 111. Thus, the interval between adjacent light-emitting elements can be extremely shortened. Accordingly, the display device can have high resolution or high definition.

[Display Panel 200B]

Figure 11:
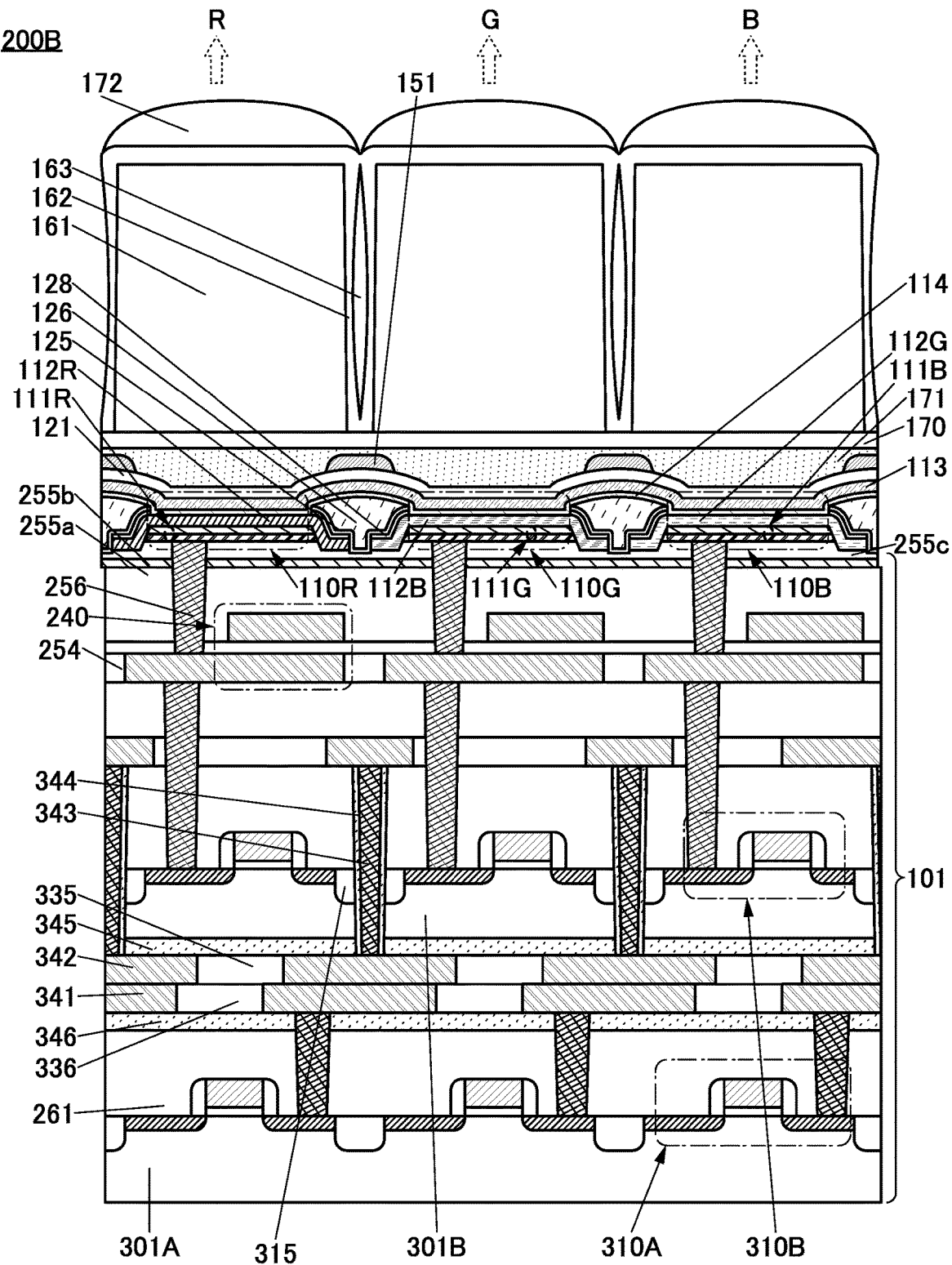
FIG. 11 is a cross-sectional view illustrating an example of a display device.

The display panel 200B illustrated in FIG. 11 has a structure in which a transistor 310A and a transistor 310B each having a channel formed in a semiconductor substrate are stacked. Note that in the following description of display panels, the description of portions similar to those of the above-described display panel may be omitted.

In the display panel 200B, a substrate 301B provided with the transistor 310B, the capacitor 240, and the light-emitting devices is attached to a substrate 301A provided with the transistor 310A.

Here, an insulating layer 345 is preferably provided on a bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 121 or an insulating layer 332 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. As the insulating layer 344, an inorganic insulating film that can be used as the protective layer 121 can be used.

A conductive layer 342 is provided under the insulating layer 345 on the rear surface of the substrate 301B (the surface opposite to the substrate 170). The conductive layer 342 is preferably provided to be embedded in the insulating layer 335. Bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. Top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Panel 200C]

Figure 12:
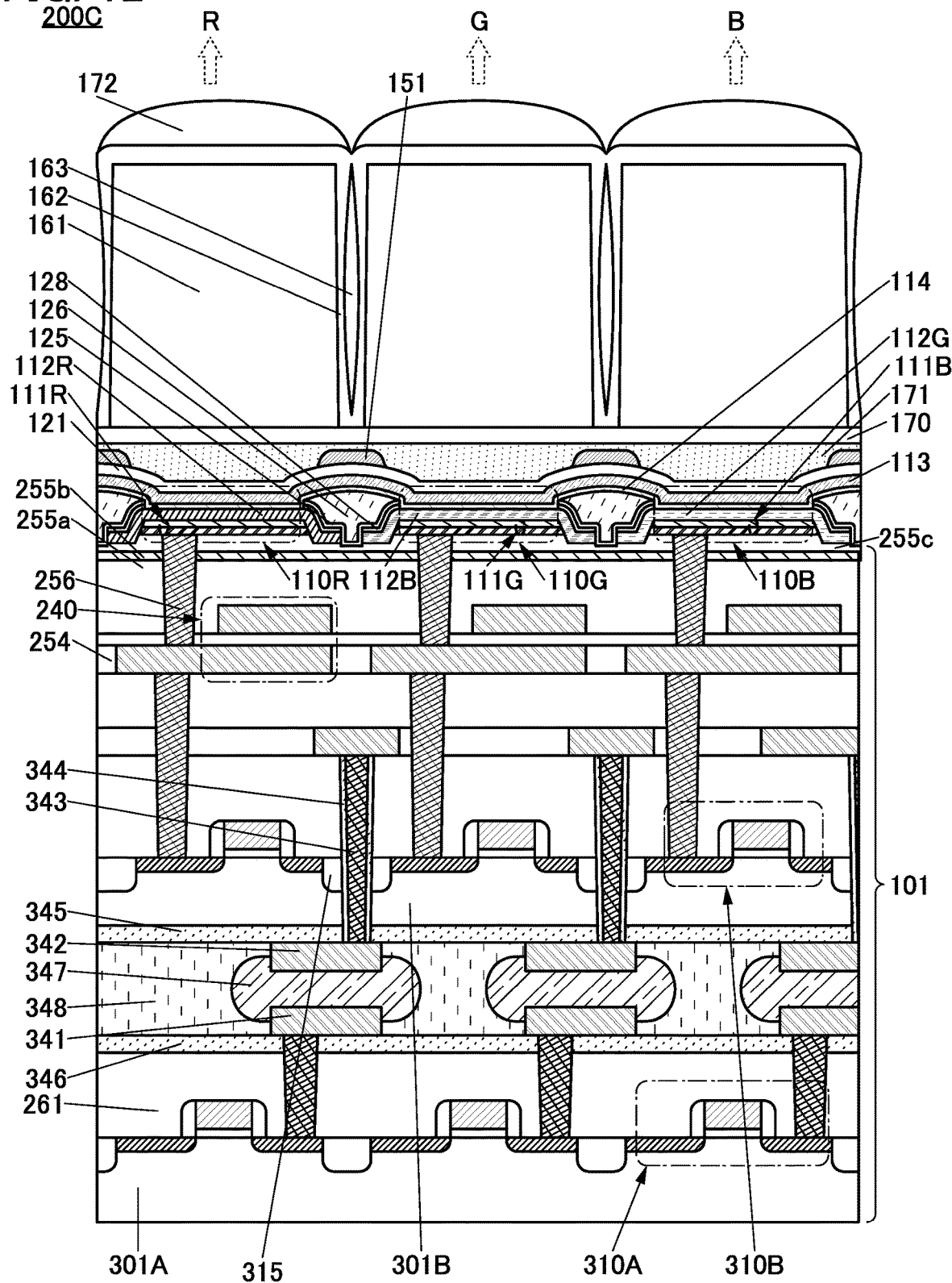
FIG. 12 is a cross-sectional view illustrating an example of a display device.

The display panel 200C illustrated in FIG. 12 has a structure in which the conductive layer 341 and the conductive layer 342 are bonded to each other with a bump 347.

As illustrated in FIG. 12, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Panel 200D]

Figure 13:
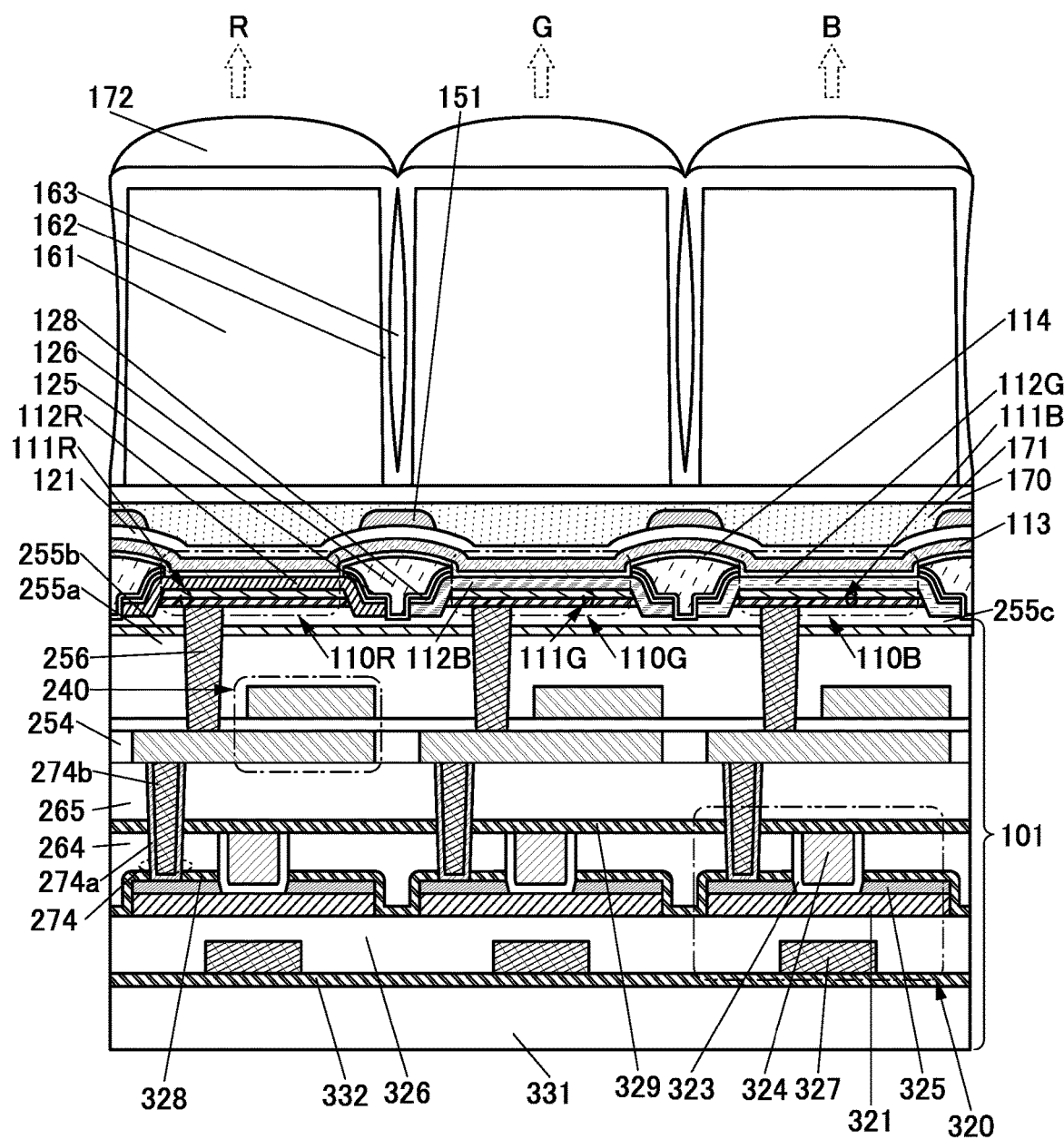
FIG. 13 is a cross-sectional view illustrating an example of a display device.

The display panel 200D illustrated in FIG. 13 differs from the display panel 200A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIGS. 9A and 9B.

The insulating layer 332 is provided over the substrate 331. The insulating layer 332 functions as a barrier layer that prevents diffusion of an impurity such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. A top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. The pair of conductive layers 325 are provided on and in contact with the semiconductor layer 321, and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of an impurity such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with side surfaces of the insulating layers 264 and 328 and the conductive layer 325 and a top surface of the semiconductor layer 321 and the conductive layer 324 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are level with or substantially level with each other, and insulating layers 329 and 265 are provided to cover these layers.

The insulating layers 264 and 265 each function as an interlayer insulating layer. The insulating layer 329 functions as a barrier layer that prevents diffusion of an impurity such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers a side surface of an opening formed in the insulating layers 265, 329, 264, and 328 and part of the top surface of the conductive layer 325, and a conductive layer 274b in contact with a top surface of the conductive layer 274a. For the conductive layer 274a, a conductive material in which hydrogen and oxygen are less likely to diffuse is preferably used.

[Display Panel 200E]

Figure 14:
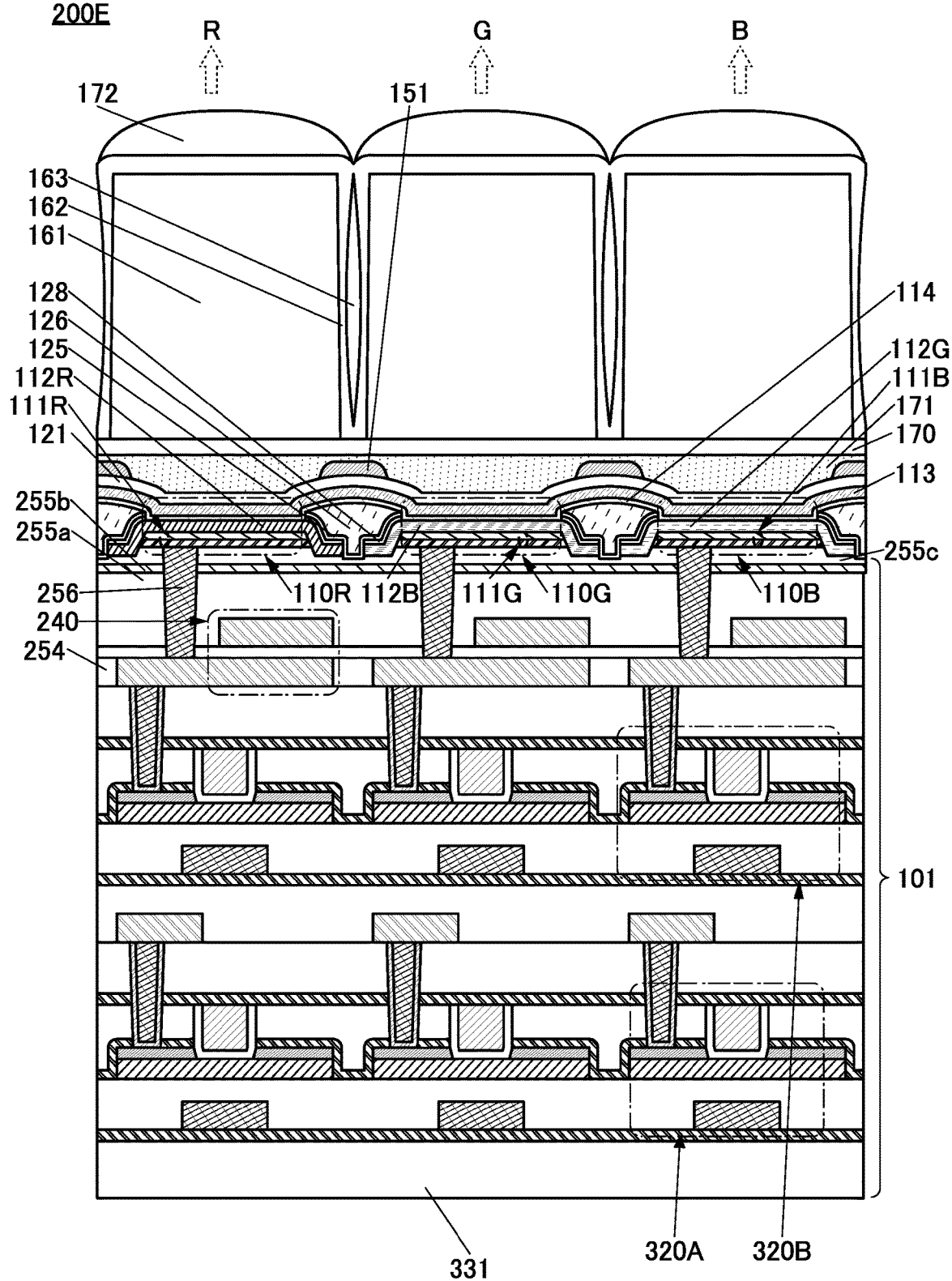
FIG. 14 is a cross-sectional view illustrating an example of a display device.

The display panel 200E illustrated in FIG. 14 has a structure in which a transistor 320A and a transistor 320B each including an oxide semiconductor in a semiconductor where a channel is formed are stacked.

The description of the display panel 200D can be referred to for the transistor 320A, the transistor 320B, and the components around them.

Although the structure in which two transistors including an oxide semiconductor are stacked is described, the present invention is not limited thereto. For example, three or more transistors may be stacked.

[Display Panel 200F]

Figure 15:
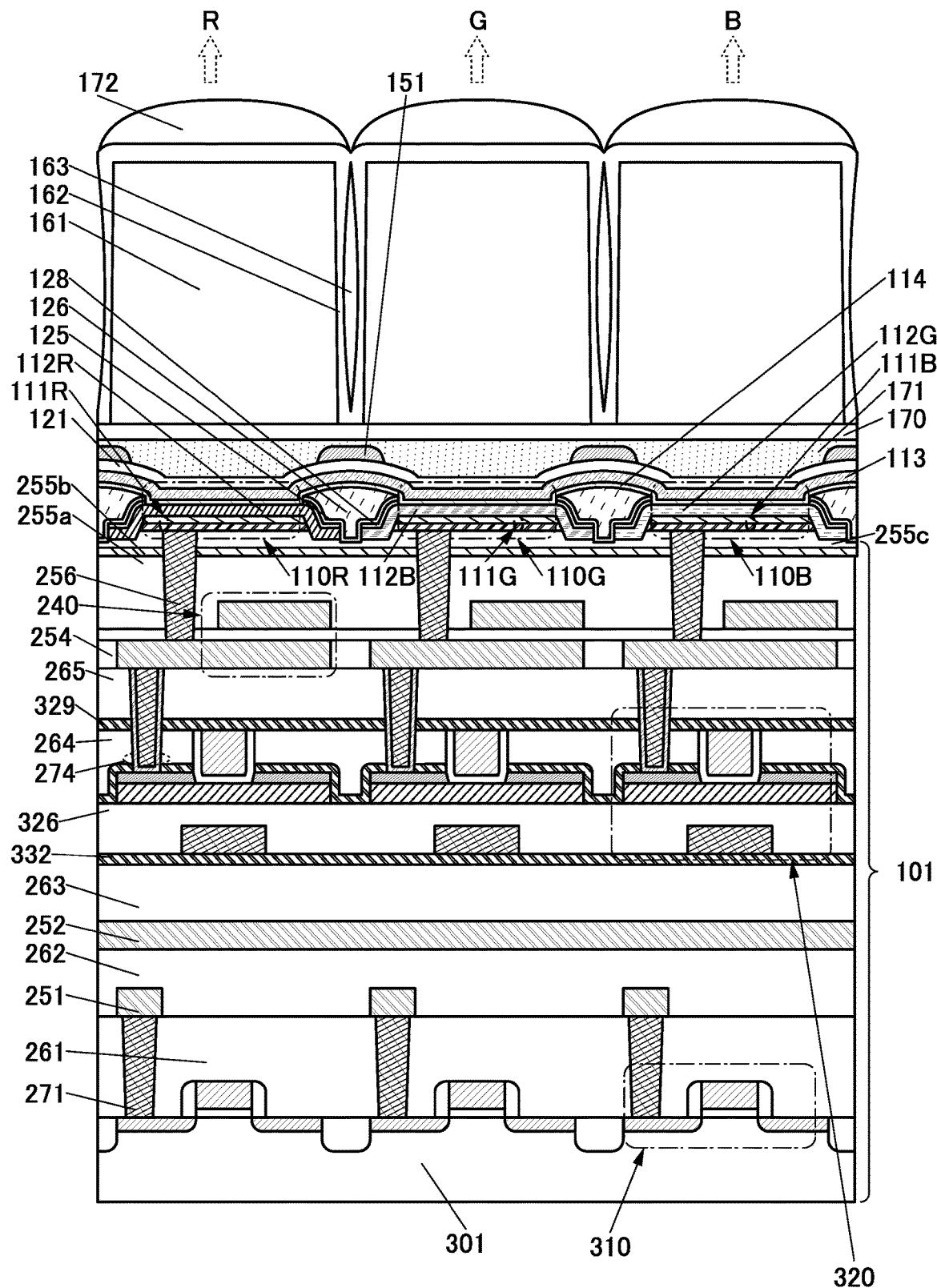
FIG. 15 is a cross-sectional view illustrating an example of a display device.

The display panel 200F illustrated in FIG. 15 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display panel can be downsized as compared with the case where a driver circuit is provided around a display region.

At least part of this embodiment can be implemented in combination with any of the other embodiments described in this specification, as appropriate.

Embodiment 3

In this embodiment, light-emitting devices that can be used in the display panel of one embodiment of the present invention are described.

Figure 16A:
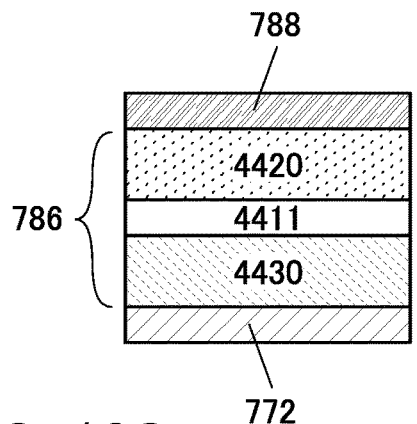
FIGS. 16A to 16F each illustrate a structure example of a light-emitting element.

As illustrated in FIG. 16A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 16A is referred to as a single structure in this specification.

Figure 16B:
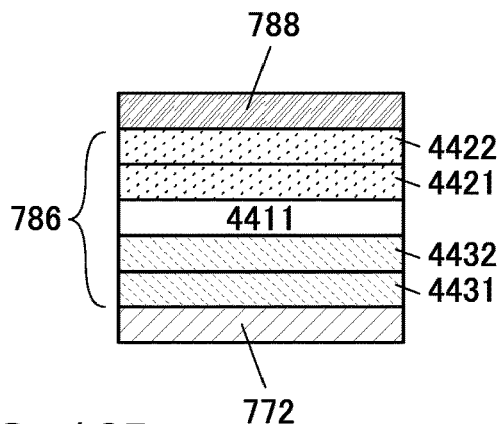

FIG. 16B is a modification example of the EL layer 786 included in the light-emitting device illustrated in FIG. 16A. Specifically, the light-emitting device illustrated in FIG. 16B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. For example, when the lower electrode 772 functions as an anode and the upper electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 functions as a cathode and the upper electrode 788 functions as an anode, the layer 4431 functions as an electron-injection layer, the layer 4432 functions as an electron-transport layer, the layer 4421 functions as a hole-transport layer, and the layer 4422 functions as a hole-injection layer. With such a layered structure, carriers can be efficiently injected to the light-emitting layer 4411, and the efficiency of the recombination of carriers in the light-emitting layer 4411 can be enhanced.

Figure 16C:
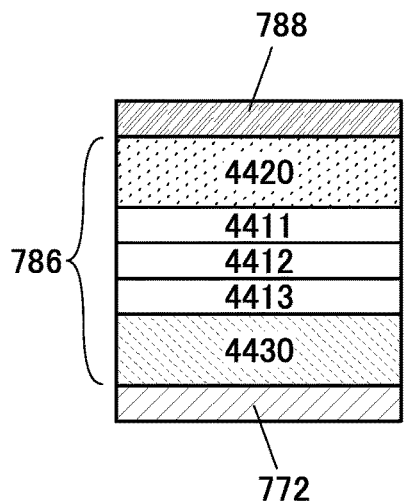
Figure 16D:
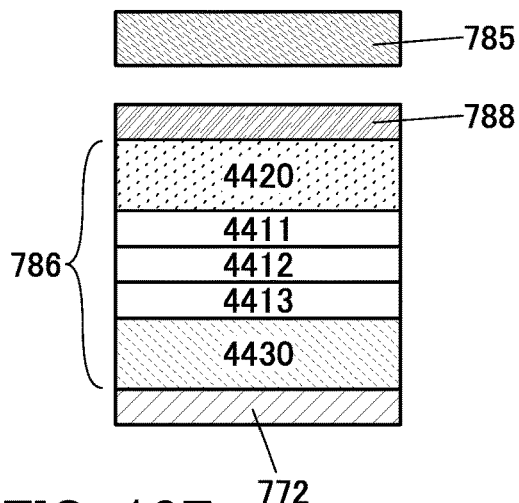

Note that structures in which a plurality of light-emitting layers (light-emitting layers 4411, 4412, and 4413) are provided between the layer 4420 and the layer 4430 as illustrated in FIG. 16C and FIG. 16D are other variations of the single structure.

Figure 16E:
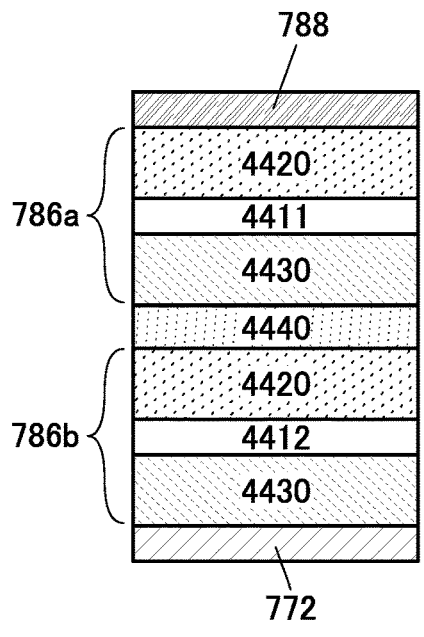
Figure 16F:
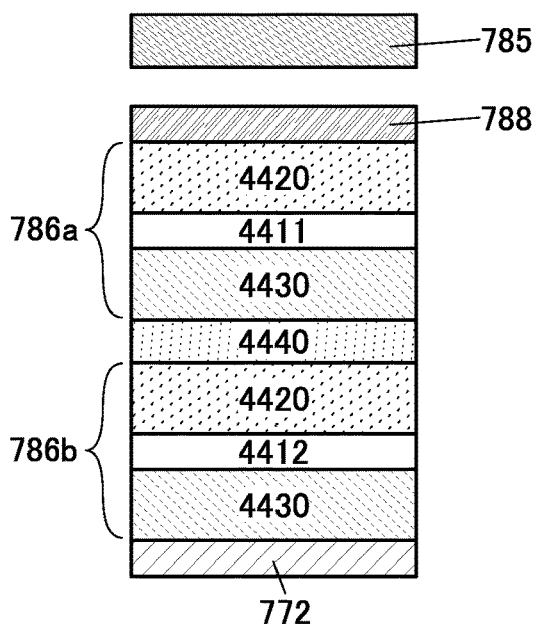

Structures in which a plurality of light-emitting units (EL layers 786a and 786b) are connected in series with a charge-generation layer 4440 therebetween as illustrated in FIG. 16E and FIG. 16F are referred to as a tandem structure in this specification. A tandem structure may be referred to as a stack structure. The tandem structure enables a light-emitting device capable of high luminance light emission.

In FIG. 16C and FIG. 16D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 16D.

Alternatively, light-emitting materials that emit light of different colors may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 16D. When white light passes through a color filter, light of a desired color can be obtained.

In FIGS. 16E and 16F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 16F illustrates an example in which the layer 785 is further provided. One or both of a color conversion layer and a color filter (coloring layer) can be used as the layer 785.

In FIGS. 16C to 16F, the layers 4420 and 4430 may each have a layered structure of two or more layers as in FIG. 16B.

A structure in which light-emitting devices that emit light of different colors (e.g., blue (B), green (G), and red (R)) are separately formed is referred to as a side-by-side (SBS) structure in some cases.

The emission color of the light-emitting device can be changed to red, green, blue, cyan, magenta, yellow, white, or the like depending on the material of the EL layer 786. When the light-emitting device has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting device can emit white light as a whole. This can be applied to a light-emitting device including three or more light-emitting layers.

The light-emitting layer preferably contains two or more substances selected from light-emitting substances that emit light of red (R), green (G), blue (B), yellow (Y), orange (O), and the like. Alternatively, the light-emitting layer preferably contains two or more light-emitting substances each of which exhibits light emission including spectral components of two or more of R, G, and B.

At least part of this embodiment can be implemented in combination with any of the other embodiments described in this specification, as appropriate.

Embodiment 4

In this embodiment, electronic devices of embodiments of the present invention are described with reference to FIGS. 17A to 17D, FIGS. 18A to 18F, and FIGS. 19A to 19G.

Electronic devices in this embodiment are each provided with the display panel of one embodiment of the present invention in a display portion. The display panel of one embodiment of the present invention can be easily increased in resolution and definition and can achieve high display quality. Thus, the display panel of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display panel of one embodiment of the present invention can have a high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display panel of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display panel of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. The use of the display panel having one or both of such high definition and high resolution can further increase realistic sensation, sense of depth, and the like in personal use such as portable use and home use. There is no particular limitation on the screen ratio (aspect ratio) of the display panel of one embodiment of the present invention. For example, the display panel is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, a current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 17A to 17D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to feel a higher level of immersion. Each of the electronic devices illustrated in FIGS. 17A to 17D is a wearable device including the display device of one embodiment of the present invention.

Figure 17A:
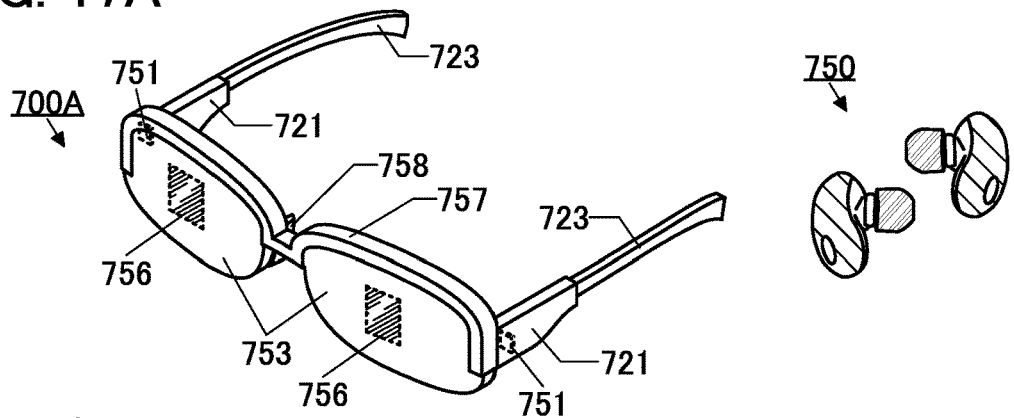
FIGS. 17A to 17D each illustrate an example of an electronic device.
Figure 17B:
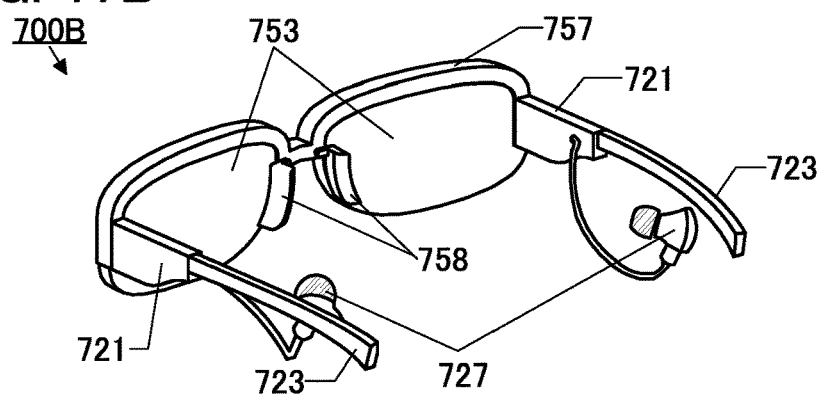

An electronic device 700A illustrated in FIG. 17A and an electronic device 700B illustrated in FIG. 17B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display panel of one embodiment of the present invention can be used in the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions 756, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 17C:
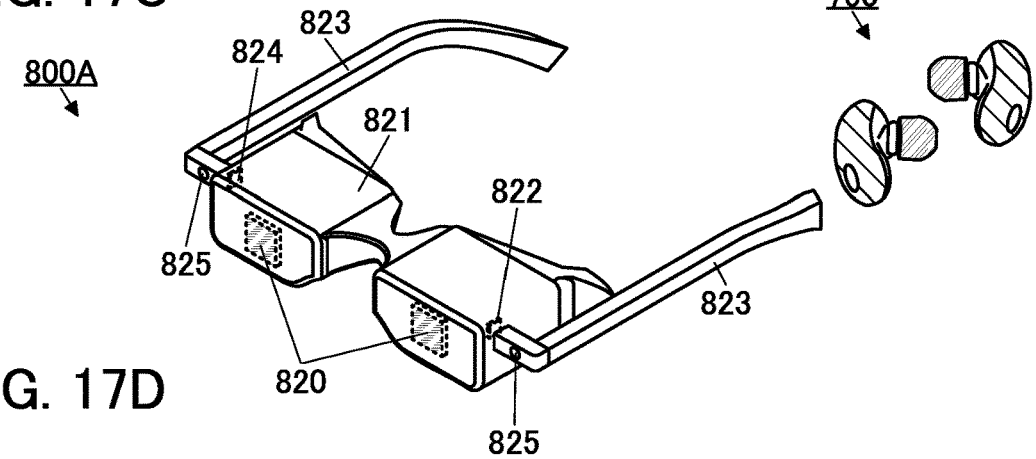
Figure 17D:
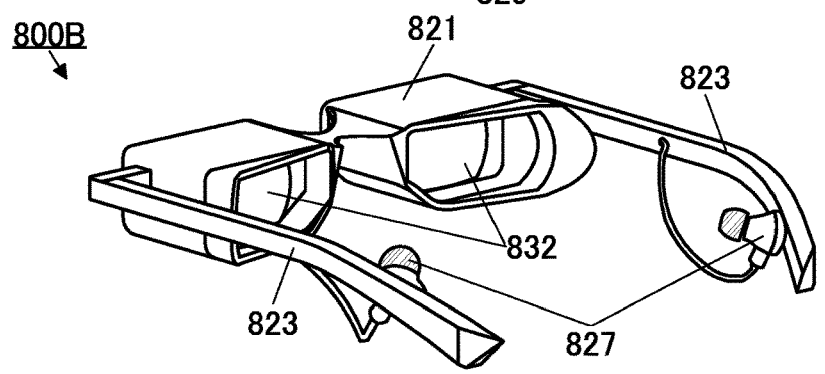

An electronic device 800A illustrated in FIG. 17C and an electronic device 800B illustrated in FIG. 17D each include a pair of display portions 820, a housing 821, a communication portion 822, a pair of wearing portions 823, a control portion 824, a pair of image capturing portions 825, and a pair of lenses 832.

The display panel of one embodiment of the present invention can be used in the display portions 820. Thus, the electronic devices are capable of performing ultrahigh-resolution display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 17C and the like show examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 17A has a function of transmitting information to the earphones 750 with the wireless communication function. For another example, the electronic device 800A in FIG. 17C has a function of transmitting information to the earphones 750 with the wireless communication function.

The electronic device may include an earphone portion. The electronic device 700B in FIG. 17B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 17D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

Each of the electronic devices illustrated in FIGS. 18A to 18F and FIGS. 19A to 19G is a terminal including the display device of one embodiment of the present invention.

Figure 18A:
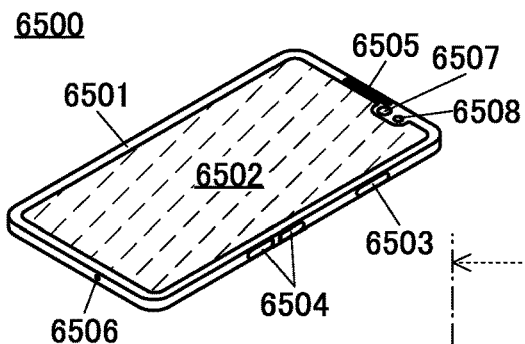
FIGS. 18A to 18F each illustrate an example of an electronic device.

An electronic device 6500 illustrated in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display panel of one embodiment of the present invention can be used in the display portion 6502.

Figure 18B:
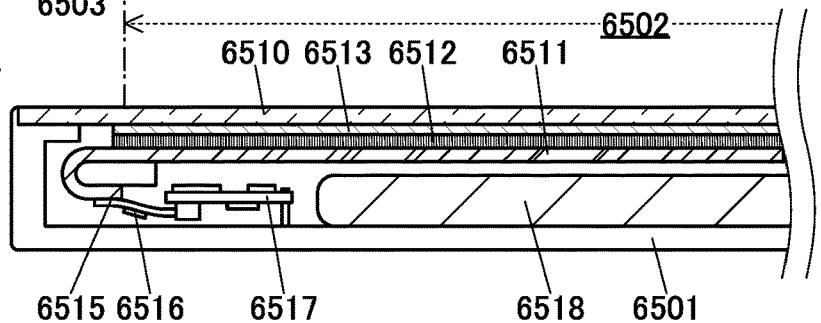

FIG. 18B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 18C:
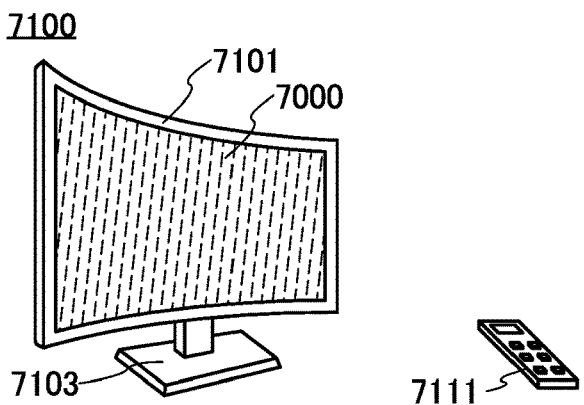

FIG. 18C illustrates an example of a television device. In a television device 7100, a display portion 7000 is incorporated in a housing 7101. Here, the housing 7101 is supported by a stand 7103.

The display panel of one embodiment of the present invention can be used in the display portion 7000.

Operation of the television device 7100 illustrated in FIG. 18C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 18D:
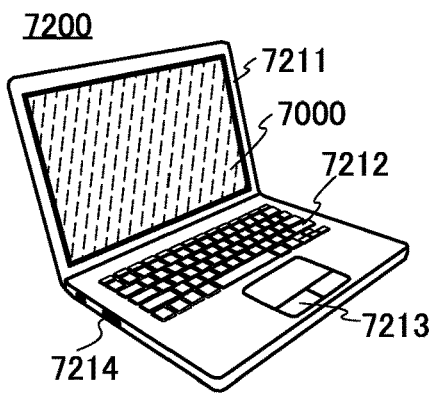

FIG. 18D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display panel of one embodiment of the present invention can be used in the display portion 7000.

Figure 18E:
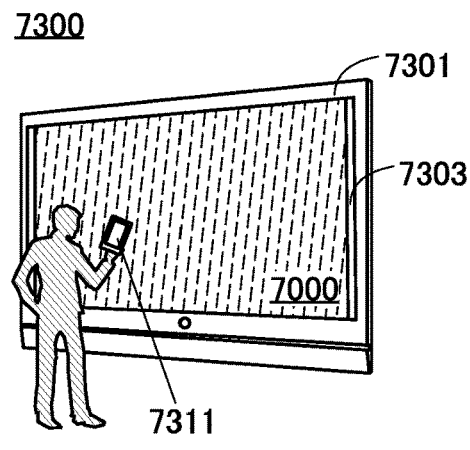
Figure 18F:
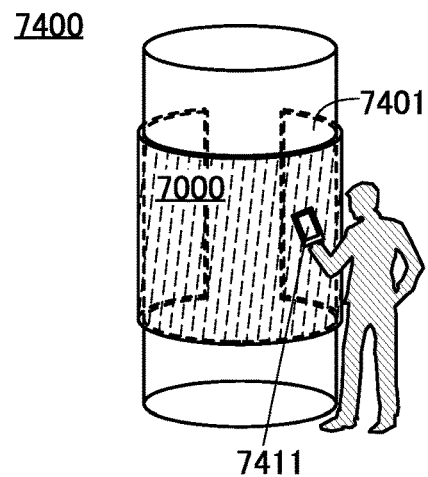

FIGS. 18E and 18F illustrate examples of digital signage.

Digital signage 7300 illustrated in FIG. 18E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 18F shows digital signage 7400 attached to a cylindrical pillar 7401. The digital signage 7400 includes the display portion 7000 provided along a curved surface of the pillar 7401.

In FIGS. 18E and 18F, the display panel of one embodiment of the present invention can be used in the display portion 7000.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 18E and 18F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 19A to 19G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, a current, voltage, electric power, radiation, flow rate, humidity, gradient, oscillation, odor, or infrared rays), a microphone 9008, and the like.

The electronic devices illustrated in FIGS. 19A to 19G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 19A to 19G are be described in detail below.

Figure 19A:
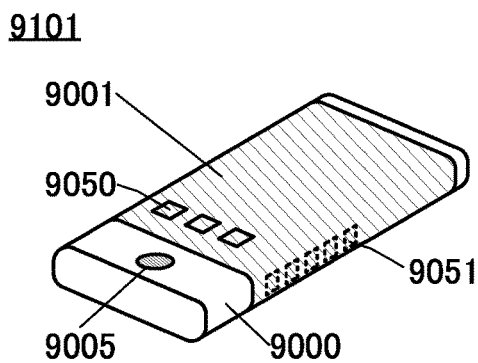
FIGS. 19A to 19G each illustrate an example of an electronic device.

FIG. 19A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 19A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 19B:
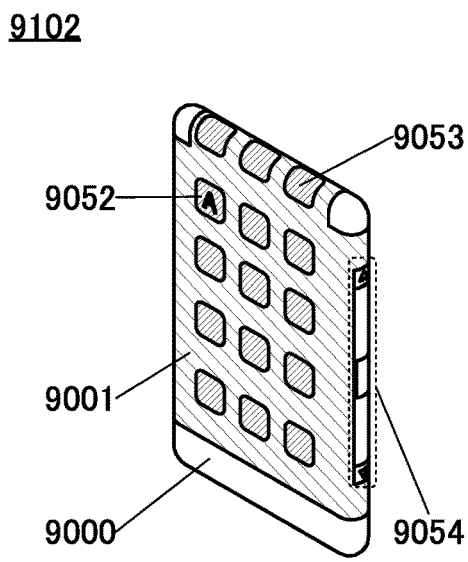

FIG. 19B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 19C:
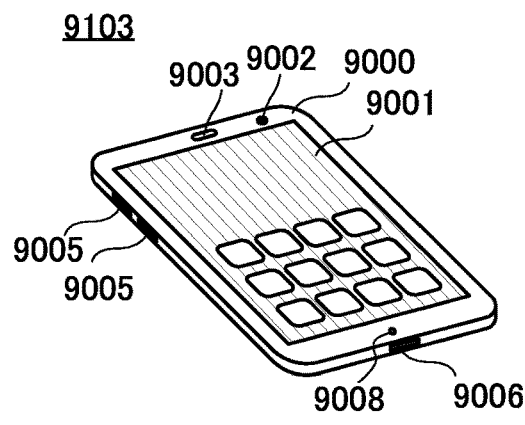

FIG. 19C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 19D:
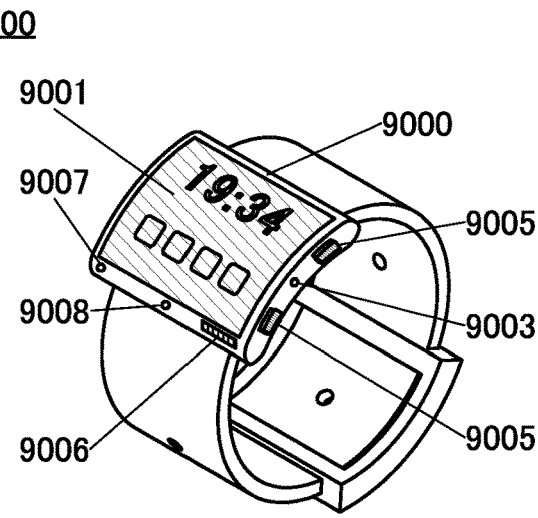

FIG. 19D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 19E:
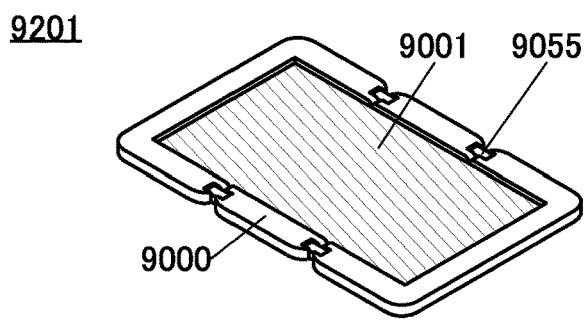
Figure 19F:
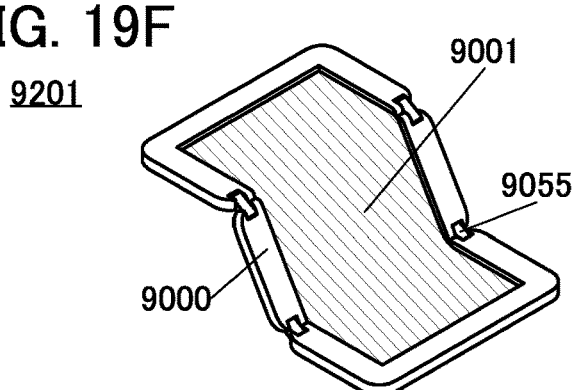
Figure 19G:
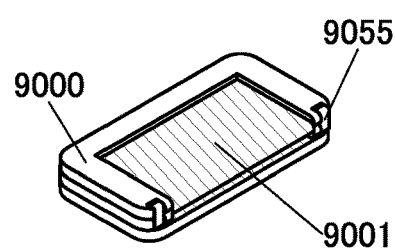

FIGS. 19E to 19G are perspective views of a foldable portable information terminal 9201. FIG. 19E is a perspective view showing the portable information terminal 9201 that is opened. FIG. 19G is a perspective view showing the portable information terminal 9201 that is folded. FIG. 19F is a perspective view showing the portable information terminal 9201 that is shifted from one of the states in FIGS. 19E and 19G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

At least part of this embodiment can be implemented in combination with any of the other embodiments described in this specification, as appropriate.

This application is based on Japanese Patent Application Serial No. 2021-101052 filed with Japan Patent Office on Jun. 17, 2021, the entire contents of which are hereby incorporated by reference.

What is claimed is:

1. A display device comprising:
   a first pixel electrode;
   a second pixel electrode;
   a first organic layer;
   a second organic layer;
   a common electrode;
   a resin layer; and
   an insulating layer,
   wherein the first organic layer is over the first pixel electrode,
   wherein the second organic layer is over the second pixel electrode,
   wherein the common electrode comprises:
      a portion overlapping with the first pixel electrode with the first organic layer therebetween;
      a portion overlapping with the second pixel electrode with the second organic layer therebetween; and
      a portion overlapping with the resin layer,
   wherein a side surface of the first organic layer and a side surface of the second organic layer face each other with the resin layer therebetween,
   wherein the resin layer comprises a pigment configured to absorb visible light,
   wherein the insulating layer comprises:
      a portion between the resin layer and the first organic layer; and
      a portion between the resin layer and the second organic layer, and
   wherein the insulating layer comprises silicon oxide, silicon oxynitride, silicon nitride oxide, silicon nitride, aluminum oxide, aluminum oxynitride, or hafnium oxide.

2. The display device according to claim 1,
   wherein the resin layer comprises an acrylic resin, a polyimide resin, an epoxy resin, a polyamide resin, a polyimide-amide resin, a siloxane resin, a benzocyclobutene-based resin, a phenol resin, or a precursor thereof.

3. The display device according to claim 1,
   wherein the first organic layer is configured to emit light of a color different from a color of light emitted by the second organic layer.

4. The display device according to claim 1, further comprising:
   a first coloring layer; and
   a second coloring layer,
   wherein the first coloring layer comprises a portion overlapping with the first pixel electrode with the common electrode and the first organic layer therebetween,
   wherein the second coloring layer comprises a portion overlapping with the second pixel electrode with the common electrode and the second organic layer therebetween, wherein the first coloring layer is configured to transmit light of a color different from a color of light transmitted by the second coloring layer, and wherein the first organic layer is configured to emit light of the same color as light emitted by the second organic layer.

5. A display device comprising:
a first pixel electrode;
a second pixel electrode;
a first organic layer;
a second organic layer;
a common electrode;
a resin layer;
a first light-blocking layer; and
a second light-blocking layer,
wherein the first organic layer is over the first pixel electrode,
wherein the second organic layer is over the second pixel electrode,
wherein the common electrode comprises:
   a portion overlapping with the first pixel electrode with the first organic layer therebetween;
   a portion overlapping with the second pixel electrode with the second organic layer therebetween; and
   a portion overlapping with the resin layer,
wherein a side surface of the first organic layer and a side surface of the second organic layer face each other with the resin layer therebetween,
wherein the first light-blocking layer is over the common electrode and overlaps with the resin layer,
wherein the first light-blocking layer comprises a pigment configured to absorb visible light,
wherein the second light-blocking layer overlaps with the resin layer with the first light-blocking layer and the common electrode between the second light-blocking layer and the resin layer, and
wherein the second light-blocking layer comprises a pigment configured to absorb visible light.

6. The display device according to claim 5,
wherein the resin layer comprises an acrylic resin, a polyimide resin, an epoxy resin, a polyamide resin, a polyimide-amide resin, a siloxane resin, a benzocyclobutene-based resin, a phenol resin, or a precursor thereof.

7. The display device according to claim 5, further comprising an insulating layer,
wherein the insulating layer comprises:
   a portion between the resin layer and the first organic layer; and
   a portion between the resin layer and the second organic layer, and
wherein the insulating layer comprises silicon oxide, silicon oxynitride, silicon nitride oxide, silicon nitride, aluminum oxide, aluminum oxynitride, or hafnium oxide.

8. The display device according to claim 5,
wherein the first organic layer is configured to emit light of a color different from a color of light emitted by the second organic layer.

9. The display device according to claim 5, further comprising:
a first coloring layer; and
a second coloring layer,
wherein the first coloring layer comprises a portion overlapping with the first pixel electrode with the common electrode and the first organic layer therebetween,
wherein the second coloring layer comprises a portion overlapping with the second pixel electrode with the common electrode and the second organic layer therebetween,
wherein the first coloring layer is configured to transmit light of a color different from a color of light transmitted by the second coloring layer, and
wherein the first organic layer is configured to emit light of the same color as light emitted by the second organic layer.

* * * * *